US010969701B2

(12) United States Patent
Van Der Meulen et al.

(10) Patent No.: US 10,969,701 B2
(45) Date of Patent: Apr. 6, 2021

(54) PELLICLE ATTACHMENT APPARATUS

(71) Applicant: ASML Netherlands B.V., Veldhoven (NL)

(72) Inventors: Frits Van Der Meulen, Eindhoven (NL); Maarten Mathijs Marinus Jansen, Eindhoven (NL); Jorge Manuel Azeredo Lima, Veldhoven (NL); Derk Servatius Gertruda Brouns, Herentals (BE); Marc Bruijn, Eindhoven (NL); Jeroen Dekkers, Eindhoven (NL); Paul Janssen, Eindhoven (NL); Ronald Harm Gunther Kramer, Hooge Mierde (NL); Matthias Kruizinga, Herten (NL); Robert Gabriël Maria Lansbergen, Schiedam (NL); Martinus Hendrikus Antonius Leenders, Rhoon (NL); Erik Roelof Loopstra, Eindhoven (NL); Gerrit Van Den Bosch, Geldermalsen (NL); Jérôme François Sylvain Virgile Van Loo, Tilburg (NL); Beatrijs Louise Marie-Joseph Katrien Verbrugge, Kasterlee (BE); Angelo Cesar Peter De Klerk, Etten-Leur (NL); Jacobus Maria Dings, Veldhoven (NL); Maurice Leonardus Johannes Janssen, Munstergeleen (NL); Roland Jacobus Johannes Kerstens, Noordhoek (NL); Martinus Jozef Maria Kester, Breda (NL); Michel Loos, Oirschot (NL); Geert Middel, Eindhoven (NL); Silvester Matheus Reijnders, Asten (NL); Frank Johannes Christiaan Theuerzeit, Grubbenvorst (NL); Anne Johannes Wilhelmus Van Lievenoogen, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 7 days.

(21) Appl. No.: 16/572,156

(22) Filed: Sep. 16, 2019

(65) Prior Publication Data
US 2020/0012204 A1 Jan. 9, 2020

Related U.S. Application Data

(63) Continuation of application No. 15/526,639, filed as application No. PCT/EP2015/076688 on Nov. 16, 2015, now Pat. No. 10,539,886.

(60) Provisional application No. 62/080,561, filed on Nov. 17, 2014, provisional application No. 62/108,348, filed on Jan. 27, 2015, provisional application No. 62/110,841, filed on Feb. 2, 2015, provisional application No. 62/126,173, filed on Feb. 27, 2015, provisional application No. 62/149,176, filed on Apr. 17, 2015, provisional application No. 62/183,342, filed on Jun. 23, 2015.

(51) Int. Cl.
G03F 7/20 (2006.01)
G03F 1/64 (2012.01)

(52) U.S. Cl.
CPC ............ G03F 7/70983 (2013.01); G03F 1/64 (2013.01); G03F 7/70825 (2013.01)

(58) Field of Classification Search
CPC .......... G03F 1/62; G03F 1/64; G03F 7/70983; G03F 7/70825
USPC ........................................................... 430/5
See application file for complete search history.

(56) References Cited

U.S. PATENT DOCUMENTS

| 4,833,051 | A | 5/1989 | Imamura |
| 5,576,125 | A | 11/1996 | Bih |
| 6,192,100 | B1 | 2/2001 | Acosta et al. |
| 6,197,454 | B1 | 3/2001 | Yan |
| 6,665,049 | B1 | 12/2003 | Takahashi |
| 6,754,303 | B2 | 6/2004 | Kasumi |
| 6,894,766 | B1 | 5/2005 | West et al. |
| 6,911,283 | B1 | 6/2005 | Gordon et al. |
| 6,912,043 | B2 | 6/2005 | Galburt |
| 7,507,264 | B2 | 3/2009 | Matsumoto |
| 7,829,248 | B2 | 11/2010 | Lin et al. |
| 8,133,640 | B2 | 3/2012 | Lee et al. |
| 8,139,199 | B2 | 3/2012 | Noboru |
| 8,338,060 | B2 | 12/2012 | Sekihara |
| 8,854,600 | B2 | 10/2014 | Mizumura |
| 9,110,387 | B2 | 8/2015 | Butler et al. |

(Continued)

FOREIGN PATENT DOCUMENTS

| CN | 1776527 A | 5/2006 |
| CN | 101241319 A | 8/2008 |

(Continued)

OTHER PUBLICATIONS

Notice of Allowance directed to related U.S. Appl. No. 15/526,639, dated Nov. 14, 2019; 2 pages.

(Continued)

*Primary Examiner* — Christopoher G Young
(74) *Attorney, Agent, or Firm* — Sterne, Kessler, Goldstein & Fox P.L.L.C.

(57) ABSTRACT

Tooling for a mask assembly suitable for use in a lithographic process, the mask assembly comprising a patterning device; and a pellicle frame configured to support a pellicle and mounted on the patterning device with a mount; wherein the mount provides a releasably engageable attachment between the patterning device and the pellicle frame.

23 Claims, 25 Drawing Sheets

(56) References Cited

U.S. PATENT DOCUMENTS

| | | |
|---|---|---|
| 10,139,725 B2 | 11/2018 | Wiley et al. |
| 10,268,126 B2 | 4/2019 | Shibazaki |
| 10,539,886 B2 | 1/2020 | Van der Meulen et al. |
| 10,558,129 B2 | 2/2020 | Kruizinga et al. |
| 2002/0090558 A1 | 7/2002 | Shirasaki |
| 2002/0098420 A1 | 7/2002 | Eynon |
| 2002/0154285 A1 | 10/2002 | Ramamoorthy et al. |
| 2002/0155359 A1 | 10/2002 | Muzio et al. |
| 2003/0020894 A1 | 1/2003 | Wang |
| 2003/0058424 A1 | 3/2003 | Ramamoorthy et al. |
| 2003/0095245 A1 | 5/2003 | Mishiro et al. |
| 2003/0227605 A1 | 12/2003 | Del Puerto et al. |
| 2004/0137339 A1 | 7/2004 | Zhang et al. |
| 2005/0045262 A1 | 3/2005 | Eschbach et al. |
| 2005/0243452 A1 | 11/2005 | Gallagher et al. |
| 2006/0105571 A1 | 5/2006 | Colburn et al. |
| 2006/0227314 A1 | 10/2006 | Frye et al. |
| 2006/0246234 A1 | 11/2006 | Meyers et al. |
| 2008/0213679 A1 | 9/2008 | Miyakawa et al. |
| 2008/0259291 A1 | 10/2008 | Banine et al. |
| 2009/0029268 A1 | 1/2009 | Lin et al. |
| 2010/0279212 A1 | 11/2010 | Shirasaki |
| 2010/0323302 A1 | 12/2010 | Hanazaki et al. |
| 2012/0140199 A1 | 6/2012 | Hotzel |
| 2013/0065160 A1 | 3/2013 | Lao |
| 2013/0088699 A1 | 4/2013 | Yakunin et al. |
| 2013/0329209 A1 | 12/2013 | Shibazaki |
| 2014/0106265 A1 | 4/2014 | Sekihara |
| 2018/0329314 A1 | 11/2018 | Kruizinga et al. |
| 2019/0025717 A1 | 1/2019 | Van Der Meulen et al. |
| 2020/0057394 A1 | 2/2020 | Kruizinga et al. |
| 2020/0096882 A1 | 3/2020 | Van Der Menlen et al. |

FOREIGN PATENT DOCUMENTS

| | | |
|---|---|---|
| CN | 101276072 A | 10/2008 |
| CN | 101354527 A | 1/2009 |
| CN | 101689018 A | 3/2010 |
| CN | 101876786 A | 11/2010 |
| CN | 102141727 A | 8/2011 |
| CN | 102197340 A | 9/2011 |
| CN | 102799071 A | 11/2012 |
| CN | 202794840 U | 3/2013 |
| CN | 103246157 A | 8/2013 |
| CN | 203422554 U | 2/2014 |
| CN | 103728829 A | 4/2014 |
| CN | 103728841 A | 4/2014 |
| CN | 2036 50297 U | 6/2014 |
| CN | 104024942 A | 9/2014 |
| EP | 1445652 A2 | 8/2004 |
| JP | S61145936 U | 9/1986 |
| JP | S61245163 A | 10/1986 |
| JP | S63-220143 A | 9/1988 |
| JP | H03042153 U | 4/1991 |
| JP | H09204039 A | 8/1997 |
| JP | H11-202476 A | 7/1999 |
| JP | H11194481 A | 7/1999 |
| JP | H11202476 A | 7/1999 |
| JP | H11258779 A | 9/1999 |
| JP | H11295880 A | 10/1999 |
| JP | 2003059801 A | 2/2003 |
| JP | 2003-307832 A | 10/2003 |
| JP | 2004153122 A | 5/2004 |
| JP | 2004179515 A | 6/2004 |
| JP | 2004-240221 A | 8/2004 |
| JP | 2004-341225 A | 12/2004 |
| JP | 2005070191 A | 3/2005 |
| JP | 2005509185 A | 4/2005 |
| JP | 2005195992 A | 7/2005 |
| JP | 2006003620 A | 1/2006 |
| JP | 2007042799 A | 2/2007 |
| JP | 2010217698 A | 9/2010 |
| JP | 2011-085831 A | 4/2011 |
| JP | 2011137951 A | 7/2011 |
| JP | 2012-092248 A | 5/2012 |
| JP | 5600921 B2 | 10/2014 |
| JP | 2014527291 T | 10/2014 |
| JP | 2014215588 A | 11/2014 |
| JP | 2015-138128 A | 7/2015 |
| KR | 20050003293 A | 1/2005 |
| KR | 20090022165 A | 3/2009 |
| KR | 20110080844 A | 7/2011 |
| KR | 20120113176 A | 10/2012 |
| KR | 101317206 B1 | 10/2013 |
| TW | 371726 B | 10/1999 |
| TW | 473652 B | 1/2002 |
| TW | 201443554 A | 11/2014 |
| WO | WO 2012/172642 A1 | 12/2012 |
| WO | WO 2015/182483 A1 | 12/2015 |

OTHER PUBLICATIONS

Notice of Allowance directed to related U.S. Appl. No. 15/526,639, dated Dec. 17, 2019; 2 pages.

Notice of Allowance directed to related U.S. Appl. No. 15/526,654, dated Jan. 13, 2020; 2 pages.

International Search Report and Written Opinion directed to International Patent Application No. PCT/EP2015/076687, dated Aug. 3, 2016; 19 pages.

International Search Report and Written Opinion directed to International Patent Application No. PCT/EP2015/076688, dated Aug. 2, 2016; 15 pages.

International Preliminary Report on Patentability directed to related International Patent Application No. PCT/EP2015/076688, dated May 23, 2017; 9 pages.

International Preliminary Report on Patentability directed to related International Patent Application No. PCT/EP2015/076687, dated May 23, 2017; 13 pages.

Non-Final Office Action directed to related U.S. Appl. No. 15/526,639, dated Feb. 11, 2019; 9 pages.

Notice of Allowance directed to related U.S. Appl. No. 15/526,639, dated May 30, 2019; 5 pages.

Notice of Allowance directed to related U.S. Appl. No. 15/526,654, dated Jun. 20, 2019; 7 pages.

PELLICLE ATTACHMENT APPARATUS

CROSS-REFERENCE TO RELATED APPLICATIONS

This application is a continuation of U.S. patent application Ser. No. 15/526,639, 371(c) Date May 12, 2017, which is a U.S. National Stage Entry of International Application No. PCT/EP2015/076688, filed Nov. 16, 2015, which claims benefit of U.S. application No. 62/080,561, filed Nov. 17, 2014, U.S. application No. 62/108,348, filed Jan. 27, 2015, U.S. application No. 62/110,841, filed Feb. 2, 2015, U.S. application No. 62/126,173, filed Feb. 27, 2015, U.S. application No. 62/149,176, filed Apr. 17, 2015 and U.S. application No. 62/183,342, filed Jun. 23, 2015, which are all incorporated herein in its entirety by reference.

FIELD

The present invention relates to an apparatus. The apparatus may be used in connection with a pellicle for a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A patterning device (e.g., a mask) that is used to impart a pattern to a radiation beam in a lithographic apparatus may form part of a mask assembly. A mask assembly may include a pellicle that protects the patterning device from particle contamination. The pellicle may be supported by a pellicle frame.

It may be desirable to provide an apparatus that obviates or mitigates one or more problems associated with the prior art.

SUMMARY

According to a first aspect of the invention there is provided a pellicle attachment apparatus comprising a support structure configured to support a pellicle frame, and a pellicle handling system configured to place the pellicle onto the pellicle frame, wherein the apparatus further comprises actuators configured to provide relative movement between the pellicle frame and the pellicle before the pellicle is placed on the pellicle frame.

The actuators allow alignment between the pellicle frame and the pellicle to be achieved before the pellicle is placed on the pellicle frame, thus allowing accurate positioning of the pellicle relative to the pellicle frame.

The actuators may be configured to move the support structure, and thus the pellicle frame, relative to the pellicle.

The pellicle handling system may comprise support arms which are configured to hold the pellicle.

Each support arm may include a conduit configured to deliver a vacuum to a foot of that arm.

The foot may be dimensioned to receive a portion of a border of the pellicle.

The support arm may extend downwardly from a connector arm which extends from a frame of the pellicle handling system.

The connector arm may include one or more leaf springs which allow the connector arm to move in a generally vertical direction.

Adjustable end stops may project from the pellicle handling system frame and prevent downward movement of the connector arm beyond a predetermined position.

Bellows may extend between the support arm and the pellicle handling system frame, the bellows connecting the conduit in the support arm to a conduit in the frame.

The support structure may include windows positioned to allow pellicle border edges and/or pellicle frame edges to be visible from an opposite side of the support structure.

Imaging sensors may be provided on one side of the windows and are configured to look through the windows to view the pellicle border edges and/or pellicle frame edges on an opposite side of the window.

Alignment marks may be provided on the windows

The pellicle attachment apparatus may further comprise arms which are configured to press downwardly on the pellicle after it has been placed on the pellicle frame, thereby holding the pellicle on the pellicle frame during curing of glue at an interface between the pellicle and the pellicle frame.

Each arm may be provided with a weight. Downward pressure applied by the arm to the pellicle may be determined by the heaviness of the weight.

Each arm may include a downwardly extending finger which is configured to press against the pellicle The finger may be laterally moveable relative to other parts of the arm.

Each arm may extend from a support frame and include a portion which is moveable in a generally vertical direction relative to the support frame.

Each arm may include end stops which limit movement of the moveable portion of that arm relative to a fixed portion of that arm.

According to a second aspect of the invention these is provided a pellicle frame attachment apparatus configured to receive a patterning device and a pellicle assembly comprising a pellicle frame and a pellicle, the pellicle attachment device comprising manipulators configured to operate an engagement mechanism of a sub-mount provided on a pellicle frame, wherein the manipulators project through or project from openings provided in a partition which separates a pellicle assembly receiving controlled environment from other parts of the pellicle frame attachment apparatus.

The partition includes windows positioned to allow pellicle border edges, pellicle frame edges and/or alignment marks on the patterning device to be visible from an opposite side of the partition.

Imaging sensors may be provided on one side of the windows. The imaging sensors may be configured to look through the windows to view the pellicle edges, pellicle frame edges and/or alignment marks on the patterning device.

Alignment marks may be provided on the windows.

The manipulators may comprise pins connected to an actuator, the actuator being configured to move the pins in a generally vertical direction.

The pins may be moveable relative to a pair of hooked arms.

The pair of hooked arms may be connected to an actuator. The actuator may be configured to move the hooked arms in a generally horizontal direction.

The pair of hooked arms may be fixed to the partition, the actuator being configured to move the partition and the pair of hooked arms in unison.

An additional pin may be provided, the additional pin being movable in the generally vertical direction relative to the moveable pins.

The additional pin may be resiliently biased relative to the moveable pins.

The partition may be connected to or may form part of a support structure.

Ends of the manipulators may be provided with a coating of robust material.

The pellicle frame attachment apparatus may include a gas outlet in the controlled environment, the gas outlet being configured to supply gas at a pressure which is higher than a gas pressure on an opposite side of the partition.

According to a third aspect of the invention there is provided a stud attachment apparatus comprising a support structure configured to hold a patterning device and a stud manipulator configured to bring a stud into contact with the patterning device, wherein the stud manipulator is separated from a patterning device receiving controlled environment by a partition, the partition including a hole through which the stud may project in order to contact the patterning device.

The stud manipulator may be one of a plurality of stud manipulators, and the hole in the partition may be one of a plurality of holes.

The stud attachment apparatus may include a gas outlet in the controlled environment, the gas outlet being configured to supply gas at a pressure which is higher than a gas pressure on an opposite side of the partition.

A seal may be provided around the stud manipulator. The seal may, in use, provide a seal relative to the patterning device to isolate a stud receiving part of the patterning device from other parts of the patterning device.

At least one gas delivery channel and at least one gas extraction channel may be provided via which a flow of gas may be provided to and from the stud receiving part of the patterning device.

The seal may be a leakage seal.

The stud manipulator may include a heater.

The partition may include windows positioned to allow alignment marks on the patterning device to be visible from an opposite side of the partition.

Imaging sensors may be provided on one side of the windows and are configured to look through the windows to view the alignment marks on the patterning device.

A kinematic connection may be provided between the stud manipulator and the support structure.

According to a fourth aspect of the invention there is provided a stud removal apparatus comprising a support structure configured to hold a patterning device, a stud gripper which is configured to receive and retain a distal head of a stud projecting from the patterning device, actuators configured to move the stud gripper relative to the stud and patterning device, and a heater.

The stud gripper may comprise a pair of flanges with a separation which is wider than a neck of the stud and narrower than a distal head of the stud.

The stud removal apparatus may further comprise a weight which is connected to the stud gripper and pulls downwardly on the stud gripper.

The stud removal apparatus may further comprise a pusher arm which is moveable in a generally horizontal direction relative to the stud gripper, the pusher arm being configured to push a stud out of the stud gripper after it has been removed from a patterning device.

The stud removal apparatus may further comprise a chute which is configured to guide studs which have been pushed out of the stud gripper.

The stud removal apparatus may further comprise a stud receptacle located at an outlet of the chute.

According to a fifth aspect of the invention there is provided a lithographic system comprising a pellicle frame attachment apparatus configured to receive a patterning device, a pellicle frame and a pellicle and attach the pellicle frame to the patterning device so as to form a mask assembly in which the pellicle frame supports the pellicle adjacent the patterning device, a lithographic apparatus comprising a support structure configured to receive the mask assembly from the pellicle frame attachment apparatus and support the mask assembly, an illumination system configured to condition a radiation beam and illuminate the mask assembly with the conditioned radiation beam, the patterning device of the mask assembly being configured to impart the conditioned radiation beam with a pattern in its cross-section to form a patterned radiation beam, a substrate table constructed to hold a substrate and a projection system configured to project the patterned radiation beam onto the substrate, the lithographic system further comprising a mask assembly transport device configured to transport the mask assembly from the pellicle frame attachment apparatus to the lithographic apparatus for use in the lithographic apparatus.

The pellicle frame attachment apparatus may be configured to attach the pellicle frame to the patterning device in a sealed environment.

The pellicle frame attachment apparatus may comprise a vacuum pump configured to pump the sealed environment of the pellicle frame attachment apparatus to vacuum pressure conditions.

The mask assembly transport device may be configured to transport the mask assembly from the pellicle frame attachment apparatus to the lithographic apparatus in a sealed environment.

The mask assembly transport device may comprise a vacuum pump configured to pump the sealed environment of the mask assembly attachment apparatus to vacuum pressure conditions.

The lithographic system may further comprise an inspection apparatus configured to inspect one or more of the pellicle, pellicle frame and patterning device for at least one of contamination or defects.

The pellicle frame attachment apparatus may be configured to receive a pellicle attached to a pellicle frame and attach the pellicle frame with the pellicle attached to a patterning device.

The illumination system may be configured to condition an EUV radiation beam.

The pellicle frame attachment apparatus may be configured to receive a pellicle which is substantially transparent to EUV radiation.

According to a sixth aspect of the invention there is provided a pellicle attachment apparatus configured to receive a pellicle and a pellicle frame, attach the pellicle to the pellicle frame to form a pellicle assembly and seal the pellicle assembly in a sealed packaging suitable for transportation of the pellicle assembly within the sealed packaging.

The pellicle attachment apparatus may be configured to attach the pellicle to the pellicle frame in a sealed environment.

The pellicle attachment apparatus may further comprise a vacuum pump configured to pump the sealed environment to vacuum pressure conditions.

The pellicle attachment apparatus may further comprise an inspection apparatus configured to inspect one or both of the pellicle and pellicle frame for at least one of contamination or defects.

According to a seventh aspect of the invention there is provided a method of attaching a pellicle to a pellicle frame, the method comprising using a pellicle frame handling system to place the pellicle frame on a support structure, applying glue to the pellicle frame, holding a pellicle above the pellicle frame using a pellicle handling system, aligning the pellicle frame and the pellicle, and placing the pellicle onto the pellicle frame.

Alignment of the pellicle frame and the pellicle may be achieved by moving the support structure which supports the pellicle frame.

The method may further comprise pressing downwardly onto the pellicle using arms, thereby holding the pellicle on the pellicle frame during curing of the glue.

The glue may be provided at spaced apart locations. An arm may press down onto the pellicle at each spaced apart location.

According to an eighth aspect of the invention there is provided a method of attaching a pellicle assembly to a patterning device, the pellicle assembly comprising a pellicle frame and a pellicle, the method comprising placing the pellicle assembly on a first part of the support structure, placing the patterning device on a second part of the support structure, with studs of the patterning device facing towards the pellicle assembly, lifting the pellicle assembly from the support structure then moving the pellicle assembly to align it relative to the patterning device, and using manipulators to operate engagement mechanisms of sub-mounts provided on the pellicle frame, the manipulators engaging the engagement mechanisms with the studs projecting from the patterning device.

The manipulators may comprise hooked arms and manipulator pins which are used to move engagement arms of each engagement mechanism relative to support arms of each engagement mechanism in order to create space to receive a distal head of one of the studs.

The hooked arms may hold the support arm of the engagement mechanism while the manipulator pins push engagement arms of the engagement mechanism upwards.

Lifting of the pellicle assembly may be performed using additional pins

According to a ninth aspect of the invention there is provided a method of attaching studs to a patterning device, the method comprising placing the studs in stud manipulators provided on a support structure, applying glue to the studs, placing the patterning device above the studs and with a patterned surface facing downwards, and moving the stud manipulators upwards to move the studs into contact with the patterning device.

The method may further comprise heating the studs using heaters in the stud manipulators in order to cure the glue.

A seal may be provided around each stud manipulator and wherein gas is delivered to the stud manipulator and then removed from the stud manipulator in order to carry contamination away from the vicinity of the seal.

The seal may be a leakage seal

According to a tenth aspect of the invention there is provided a method of removing a stud from a patterning device, the method comprising supporting the patterning device using a support, with the patterning device being oriented such that the stud projects downwardly from the patterning device, moving a stud gripper relative to the stud and thereby receiving and retaining a distal head of the stud, heating the stud gripper and thereby heating the stud to melt glue located between the stud and the patterning device, and pulling the stud downwards using the stud gripper such that the stud separates from the patterning device when the glue melts.

The stud may be pulled downwards by a weight which is connected to the stud gripper and pulls downwardly on the stud gripper.

The method may further comprise using a pusher arm to push the stud out of the stud gripper after it has been removed from a patterning device.

The method may further comprise using a chute to direct the stud to a stud receptacle.

It will be appreciated that one or more aspects or features described above or referred to in the following description may be combined with one or more other aspects or features.

BRIEF DESCRIPTION OF THE DRAWINGS

Embodiments of the invention will now be described, by way of example only, with reference to the accompanying schematic drawings, in which.

DETAILED DESCRIPTION

Figure 1:
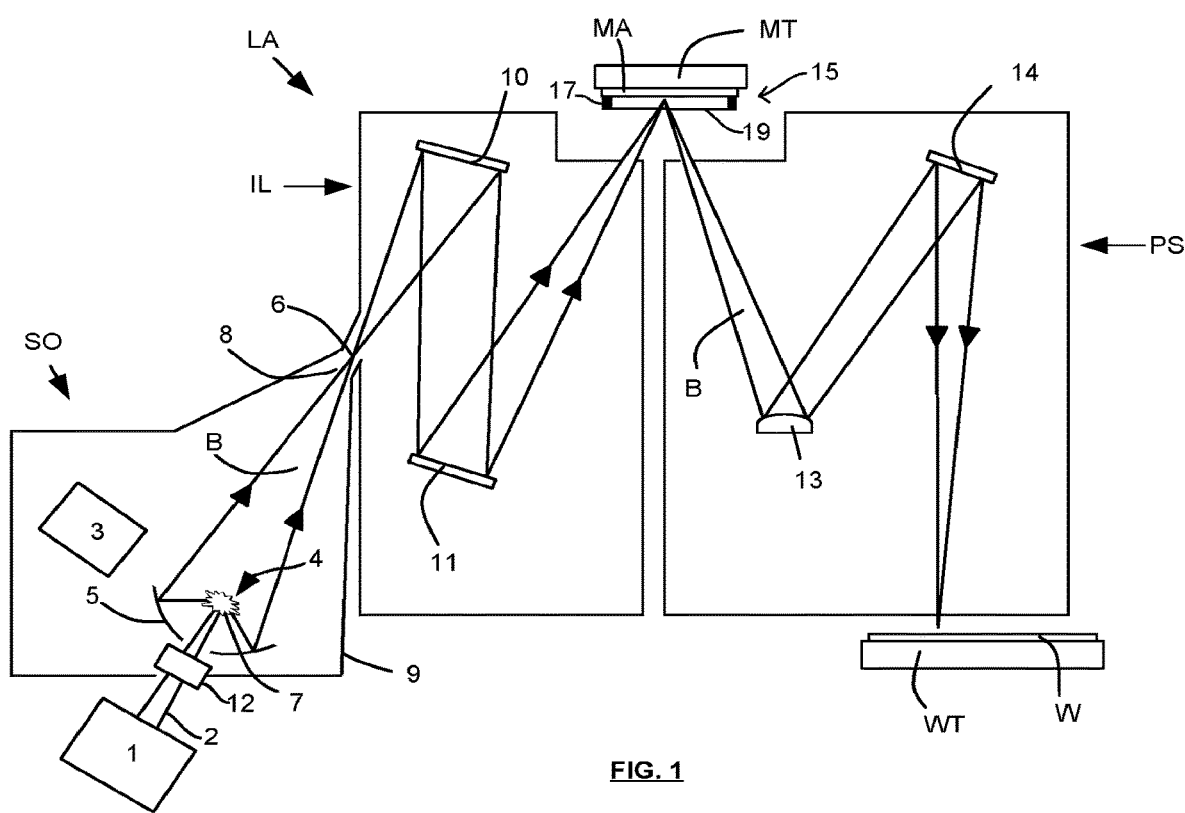
FIG. 1 is a schematic illustration of a lithographic system comprising a lithographic apparatus and a radiation source.

FIG. 1 shows a lithographic system including a mask assembly according to one embodiment of the invention. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a mask assembly 15 including a patterning device MA (e.g., a mask), a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g., hydrogen) may be provided in the radiation source SO. A vacuum may be provided in the illumination system IL and/or the projection system PS. A small amount of gas (e.g., hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g., in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask assembly 15 held by the support structure MT. The mask assembly 15 includes a patterning device MA and a pellicle 19, which is held in place by a pellicle frame 17. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g., six mirrors).

The lithographic apparatus may, for example, be used in a scan mode, wherein the support structure (e.g., mask table) MT and the substrate table WT are scanned synchronously while a pattern imparted to the radiation beam is projected onto a substrate W (i.e., a dynamic exposure). The velocity and direction of the substrate table WT relative to the support structure (e.g., mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the mask assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in the focal plane of the radiation beam B. This separation between the pellicle 19 and the patterning device MA acts to reduce the extent to which any particles on the surface of the pellicle 19 impart a pattern to the radiation beam B. It will be appreciated that where a particle is present in the beam of radiation B, but at a position that is not in a focal plane of the beam of radiation B (i.e., not at the surface of the patterning device MA), then any image of the particle will not be in focus at the surface of the substrate W. In the absence of other considerations it may be desirable to position the pellicle 19 a considerable distance away from the patterning device MA. However, in practice the space which is available in the lithographic apparatus LA to accommodate the pellicle is limited due to the presence of other components. In some embodiments, the separation between the pellicle 19 and the patterning device MA may, for example, be approximately between 1 mm and 10 mm, for example between 1 mm and 5 mm, more preferably between 2 mm and 2.5 mm.

A mask assembly may be prepared for use in a lithographic apparatus by attaching a pellicle to a pellicle frame and by attaching the pellicle frame to a patterning device. A mask assembly comprising a patterning device MA and a pellicle supported adjacent to the patterning device by a pellicle frame may be prepared remotely from a lithographic apparatus LA and the mask assembly may be transported to the lithographic apparatus LA for use in the lithographic apparatus LA. For example, a pellicle frame supporting a pellicle may be attached to a patterning device, so as to form a mask assembly, at a site at which a pattern is imparted onto the patterning device. The mask assembly may then be transported to a separate site at which a lithographic apparatus LA is situated and the mask assembly may be provided to the lithographic apparatus LA for use in the lithographic apparatus LA.

A mask assembly in which a pellicle is held in place by a pellicle frame may be delicate and transport of the mask assembly may risk damage to the pellicle. Assembling a mask assembly in a separate environment to a lithographic apparatus LA may additionally result in the mask assembly being exposed to a variety of pressure conditions. For example, a mask assembly may be transported to a lithographic apparatus under ambient pressure conditions. The mask assembly may then be loaded into the lithographic apparatus LA via a load lock which is pumped to vacuum pressure conditions. Changes in the pressure conditions to which a mask assembly is exposed may cause a pressure difference to exist across a pellicle which may cause the pellicle to bend and may risk damage to the pellicle. In an embodiment, a lithographic system may comprise a lithographic apparatus LA connected to a pellicle frame attachment apparatus. Where this is the case a mask assembly comprising a mask and pellicle may be transferred directly from the pellicle frame attachment apparatus to the lithographic apparatus whilst remaining in a controlled environment (e.g. a vacuum environment).

Figure 2:
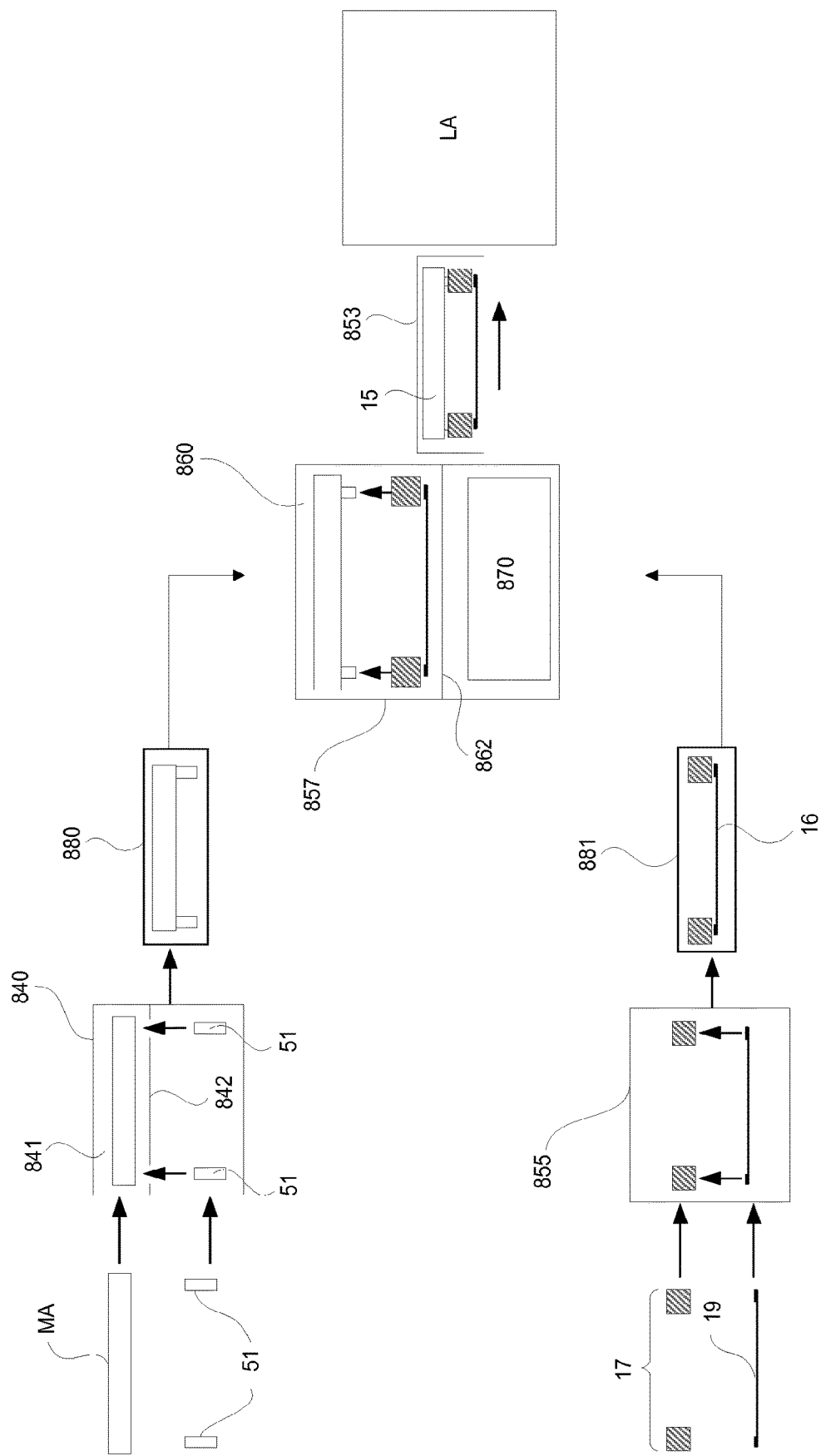
FIG. 2 is a schematic illustration of various apparatuses and a lithographic apparatus according to embodiments of the invention.

FIG. 2 is a schematic illustration of apparatus suitable for assembling a mask assembly 15 and transferring the mask assembly to a lithographic apparatus LA. FIG. 2 depicts a pellicle attachment apparatus 855 which may be used to attach a pellicle 19 to a pellicle frame 17, and a pellicle assembly transport device 881 which may be used to transport the pellicle assembly. In addition a stud attachment apparatus 840 is depicted, which may be used to attach studs 51 to a patterning device MA. The studs 51 allow releasable attachment of the pellicle frame 17 (and pellicle 19) to the patterning device MA. A mask transport device 880 which may be used to transport the mask with attached studs is also depicted. A pellicle frame attachment apparatus 857 which may be used to attach a pellicle frame 17 (and pellicle 19) to a patterning device MA, thereby forming a mask assembly 15, is also depicted. A mask assembly transport device 853 which may be used to transport the mask assembly 15 from the pellicle frame attachment apparatus 857 to the lithographic apparatus LA is also shown.

The pellicle attachment apparatus 855 may be situated at a different site from the site at which the lithographic apparatus is situated. The stud attachment apparatus 840 may be situated at a different site from the site at which the lithographic apparatus LA is situated. Alternatively, either or both of the pellicle attachment apparatus 855 and the stud attachment apparatus 840 may be located at the same site as the site at which the lithographic apparatus LA is situated (e.g. in a lithographic fab).

The pellicle attachment apparatus 855 receives a pellicle 19, a pellicle frame 17 and engagement mechanisms (not illustrated). The pellicle 19 and pellicle frame 17 may be manually placed in the pellicle attachment apparatus 855. Glue is dispensed at engagement mechanism receiving openings in the pellicle frame 17 (e.g. locations described further below). Glue dispensing may be manual, or may be automated (or partially automated). The engagement mechanisms and the pellicle frame 17 are aligned relative to each other (e.g. using an optical alignment apparatus), and the engagement mechanisms are then inserted into the openings in the pellicle frame.

Glue is also dispensed onto the pellicle frame 17 (e.g. at spaced apart locations around the pellicle frame 17). Glue dispensing may be manual, or may be automated (or partially automated). An optical alignment system is used to align the pellicle 19 relative to the pellicle frame 17, and the pellicle is then pressed against the pellicle frame.

The pellicle 19 is held pressed against the pellicle frame 17 at room temperature for a period of time sufficient to allow the glue to cure, thereby securing the pellicle to the pellicle frame. The pressure on the pellicle 19 is then removed. Additional curing of the glue at an elevated temperature is then performed using a curing oven (which may form part of the pellicle attachment apparatus). This will also cure glue which attaches the engagement mechanisms to the pellicle frame 17. In an alternative approach, some heating may be applied to cure the glue when the pellicle 19 is being held against the pellicle frame (instead of allowing curing to proceed at room temperature).

Although the use of glue to attach the pellicle 19 to the pellicle frame 17 is described above, the pellicle may be attached to the pellicle frame using any suitable type of bonding (including without using glue).

The resulting pellicle assembly 16 is inspected using a particle inspection tool. The particle inspection tool may form part of the pellicle attachment apparatus 855 (or may be a separate tool). The particle inspection tool may be configured to inspect for particles disposed on the pellicle 19 and/or the pellicle frame 17. The particle inspection tool may, for example, reject a pellicle assembly which has a number of particles which is greater than a given particle threshold. The particle inspection tool may also be used to inspect a pellicle 19 and/or a pellicle frame 17 before the pellicle and pellicle frame are glued together.

The pellicle attachment apparatus 855 may be configured, following inspection, to seal the pellicle assembly 16 in a pellicle assembly transport device 881 (a sealed box). As depicted, the pellicle assembly transport device 881 may be arranged to hold the pellicle assembly in an orientation in which the pellicle 19 is below the pellicle frame 17. Because the transport device 881 is sealed, the pellicle assembly can be transported without the pellicle assembly 16 being contaminated. The pellicle assembly 16 may be transported in the transport device 881 to a pellicle frame attachment apparatus 857.

The pellicle attachment apparatus 855 may include a clean environment so as to reduce the number of particles inside the sealed environment, thereby reducing the number or particles which may be deposited on the pellicle 19. The pellicle attachment apparatus 855 may, for example, be situated at a site at which pellicles are manufactured. In some embodiments a pellicle 19 may be provided to the pellicle attachment apparatus 855 directly from a pellicle manufacturing tool (not shown) in which the pellicle 19 is manufactured. A pellicle 19 may, for example, be provided to the pellicle attachment apparatus 855 from a pellicle manufacturing tool whilst keeping the pellicle 19 inside a clean environment. This may reduce the chance of a pellicle 19 from being contaminated or damaged before being provided to the pellicle attachment apparatus 855. The clean environment may, for example be a sealed environment (i.e. fully isolated from an external environment). The sealed environment may be pumped so as to maintain a vacuum in the sealed environment.

The attachment of the pellicle 19 to the pellicle frame 17 may be controlled so as to achieve a desirable tension in the pellicle 19. For example, the tension in the pellicle 19 may be measured during or after attachment of the pellicle 19 to the pellicle frame 17 and the tension may be adjusted in response to the measurement in order to achieve a desirable tension in the pellicle 19. The tension in the pellicle 19 may be maintained, for example, by applying an outward force to components of the pellicle frame 17 so as to stretch the pellicle 19. Tension in the pellicle 19 may for example be maintained by using differences in thermal expansion coefficients between the pellicle frame and the pellicle.

In an embodiment, the patterning device (which may be referred to as a mask) MA may be provided with protrusions which are received by engagement mechanisms (e.g. as described further below). The patterning device may for instance receive four protrusions (referred to herein as studs). As depicted in FIG. 2, the stud attachment apparatus 840 may be used to attach studs 51 to the patterning device MA.

The studs 51 and the patterning device MA may be manually placed in the stud attachment apparatus 840. The patterning device MA may be held in a controlled environment 841 which is separated from the rest of the stud attachment apparatus 840. Separation may be provided by a partition 842 with openings through which the studs 51 may project in order to contact the patterning device MA. The controlled environment 841 may be held at a higher pressure than other parts of the stud attachment apparatus 840 (e.g. by delivering gas through an outlet in the controlled environment). This will inhibit or prevent passage of contamination particles into the controlled environment 841 from other parts of the stud attachment apparatus.

The stud attachment apparatus 840 may include a stud manipulator (not depicted), such as a robot or actuators for accurately placing the studs. An example of a suitable actuator for placing studs onto the patterning device is a Lorentz actuator (not depicted). The stud attachment apparatus 840 may also include a device for automatically providing a given amount of glue or adhesive to the stud surface to be attached to the patterning device MA (although applying a glue or adhesive may also be done manually in advance). Contamination of the mask MA by contaminants from the glue or adhesive is prevented or reduced by a flow of air from the controlled environment above the partition 842 to below the partition (the flow of air is caused by the pressure above the partition being higher than the pressure below the partition).

The stud attachment apparatus 840 may further include an optical alignment system which aligns the studs with respect to the alignment markers present on the reticle in order to accurately position the studs. For example, the alignment markers conventionally provided on the patterning device MA and used for pattern alignment may also be used for aligning the studs.

The stud attachment apparatus may include a support structure movable in the X-Y-Z and Rz directions for adjusting the position of the patterning device MA. The position of the support structure holding the patterning device MA may be adjustable manually by means of coarse and fine mechanical adjusting devices, or using automated (or semi-automated) actuators or any other type of devices suitable for alignment and positioning which are coupled to the patterning device table.

Once the studs 51 and the patterning device MA have been aligned, the studs are then pressed against the patterning device MA. The studs 51 may be held against the patterning device MA at room temperature for a period of time which is sufficient to allow the glue to cure, thereby securing the studs to the mask. Alternatively, the studs 51 may be heated in order to accelerate curing of the glue. Additional curing of the glue at an elevated temperature may then be performed using a curing oven (which may form part of the stud attachment apparatus 840).

The patterning device MA and studs 51 may be inspected using a particle inspection tool (which may form part of the stud attachment apparatus 840).

The stud attachment apparatus 840 seals the patterning device MA and studs 51 in a patterning device MA transport device 880 (a sealed box). Because the mask transport device 880 is sealed, the patterning device MA and studs 51 can be transported without the mask being contaminated. The patterning device MA and studs may be transported in the transport device 880 to the pellicle frame attachment apparatus 857.

In an embodiment, the mask is provided to the stud attachment apparatus 840 in a sealed box (to reduce the risk of contamination). The box may remain sealed until just before the studs 51 are to be attached to the patterning device MA, thereby minimizing the time during which contamination could travel to the mask.

The controlled environment 841 of the stud attachment apparatus 840 may be provided in part by a housing which subsequently forms part of the patterning device MA transport device 880 (a sealed box). The housing may form walls and a roof of the transport device 880, with a floor of the transport device being formed by a plate that is fitted after the studs 51 have been attached (e.g. immediately afterwards). Using the housing in this way may assist in preventing contamination from being incident upon the patterning device MA. The housing may comprise a cover of a pod. The mask table of the stud attachment apparatus 840 may be configured to receive the housing.

Similarly, the pellicle attachment apparatus 855 may also be formed in part by a housing that subsequently forms part of the pellicle assembly transport device 881.

The pellicle assembly 16 in the transport device 881 and the patterning device MA (and studs 51) in the transport device 880 are both transported to the pellicle frame attachment apparatus 857. The pellicle frame attachment apparatus 857 may be provided in a fab in which one or more lithographic apparatus are also provided.

The pellicle frame attachment apparatus 857 is configured to attach the pellicle frame 17 of the pellicle assembly 16 to the studs 51 on the patterning device MA so as to form a mask assembly 15. The pellicle frame attachment apparatus 857 may include a controlled environment 860 which is separated from the rest of the pellicle frame attachment apparatus. Separation may be provided by a partition 862 with openings through which manipulators extend (not shown in FIG. 2). The manipulators may be operated by a control system 870 (described further below). The controlled environment 860 may be maintained as a clean environment so as to reduce the number of particles inside the controlled environment, thereby reducing the number of particles which may be deposited on the mask assembly 15. The controlled environment 860 may be held at a higher pressure than other parts of the pellicle frame attachment apparatus 857 (e.g. by delivering gas through an outlet in the controlled environment). This will inhibit or prevent passage of contamination particles into the controlled environment 860 from other parts of the pellicle frame attachment apparatus 857.

The mask assembly 15 which is assembled by the pellicle frame attachment apparatus 857 is transported from the pellicle frame attachment apparatus to the lithographic apparatus LA in a mask assembly transport device 853. The mask assembly transport device 853 may comprise a sealed and clean environment in which the mask assembly 15 is transported. This reduces the chances of the mask assembly 15 being contaminated or damaged during transport of the mask assembly. The sealed and clean environment may, for example, be pumped to a vacuum.

The pellicle frame attachment apparatus 857 may be used to mount, demount or remount the pellicle assembly 16 to/from the patterning device. The pellicle frame attachment apparatus 857 may comprise manipulators arranged to manipulate engagement mechanisms of the pellicle frame (as described further below).

The patterning device MA may, for example, be provided with alignment marks. The pellicle frame 17 may be positioned relative to the alignment marks on the patterning device. Aligning the pellicle frame 17 relative to alignment marks on the patterning device may advantageously increase the accuracy with which the pellicle frame 17 is positioned on the patterning device MA during attachment of the pellicle frame 17 to the patterning device MA.

In some embodiments the patterning device MA may be cleaned in the pellicle frame attachment apparatus 857, for example, to remove particles from the patterning device MA. In other embodiments cleaning of the patterning device MA may be performed in a dedicated cleaning tool.

Although illustrated embodiments show the pellicle frame being attached at the front of the mask, in other embodiments the pellicle frame may be attached at other parts of the mask. For example, the pellicle frame may be attached to sides of the mask. This may be achieved for example using sub-mounts which provide releasably engageable attachment between the pellicle frame and sides of the mask. In an alternative arrangement the pellicle frame may be attached to the mask through a combination of some attachment locations on sides of the mask and some attachment locations on the front of the mask. Attachment may for example be provided by sub-mounts which releasably engage the pellicle frame and the mask.

In some embodiments the pellicle frame attachment apparatus 857 may include a particle inspection tool (not shown).

The particle inspection tool may be configured to inspect the mask assembly 15 for particles disposed on the mask assembly 15. The particle inspection tool may, for example, reject mask assemblies 15 which have a number of particles disposed on them which is greater than a given particle threshold.

In some embodiments the pellicle frame attachment apparatus 857 may include a pattern inspection system which inspects the pattern on the patterning device for any defects. The pattern inspection system may inspect the pattern on the patterning device before and/or after the pellicle frame 17 is attached to the patterning device MA.

The attachment of the pellicle frame 17 to the patterning device MA may be controlled so as to achieve a desirable tension in the pellicle 19. For example, the tension in the pellicle 19 may be measured during attachment of the pellicle frame 17 to the patterning device MA and the tension may be adjusted in response to the measurement in order to achieve a desired tension in the pellicle 19.

The lithographic apparatus LA may, for example, correspond with the lithographic apparatus LA which is depicted in FIG. 1. The lithographic apparatus LA may include components which are configured to receive a mask assembly 15 from the mask assembly transport device 853 and load the mask assembly 15 onto a support structure MT of the lithographic apparatus LA. The mask assembly 15 may be illuminated with a conditioned radiation beam B provided by an illumination system IL. The patterning device MA of the mask assembly 15 may impart the conditioned radiation beam with a pattern in its cross-section to form a patterned radiation beam. The patterned radiation beam may be projected by a projection system PS onto a substrate W held by a substrate table WT. The conditioned radiation beam may, for example, comprise EUV radiation. In embodiments in which the conditioned radiation beam comprises EUV radiation the pellicle 19 of the mask assembly 15 may be substantially transparent to EUV radiation.

In some embodiments a pellicle assembly 16 may be attached to a patterning device MA so as to form a mask assembly 15 under vacuum conditions in the pellicle frame attachment apparatus 857. The mask assembly 15 may subsequently be transported to the lithographic apparatus LA under vacuum conditions by the mask assembly transport device 853 and may be held under vacuum conditions in the lithographic apparatus LA. The mask assembly 15 may therefore be exposed to approximately the same pressure conditions throughout its assembly in the pellicle frame attachment apparatus 857 and use in the lithographic apparatus LA. This advantageously reduces any pressure changes to which the mask assembly 15 is exposed and therefore reduces any pressure differences which may develop across the pellicle 19.

In some embodiments the patterning device MA and/or the pellicle 19 may be inspected for particles and/or defects in the pellicle frame attachment apparatus 857 whilst the components are held in a vacuum. The patterning device MA and/or the pellicle 19 are therefore advantageously inspected under similar pressure conditions to those to which they are exposed during use in the lithographic apparatus LA. This is advantageous since any particles which may be deposited onto patterning device MA and/or the pellicle during pumping down to vacuum conditions may be detected in the pellicle frame attachment apparatus 857.

In some embodiments the lithographic system LS may further comprise a separate inspection apparatus (not shown) which is configured to inspect one or more components of a mask assembly 15 for particles and/or defects. A mask assembly 15 may, for example, be transported to an inspection apparatus (e.g. by the mask assembly transport device 853) after being assembled in the pellicle frame attachment apparatus 857 and prior to transporting the mask assembly 15 to the lithographic apparatus LA.

Embodiments of the invention as described above advantageously allow a mask assembly 15 to be assembled and passed to a lithographic apparatus LA in an automated (or semi-automated) process. The assembly and transport of the mask assembly 15 may all be conducted in a sealed clean environment which may, for example, be pumped to vacuum pressure conditions. This may reduce the chance of components of the mask assembly 15 from being contaminated or damaged prior to the use of the mask assembly 15 in a lithographic apparatus LA.

In general, the useful lifetime of a pellicle 19 may be less than the useful lifetime of a patterning device MA. It may therefore be desirable to remove a pellicle assembly 16 from patterning device MA and replace the pellicle assembly with a new pellicle assembly so as to allow for continued use of the patterning device MA. Replacement of a pellicle assembly 16 may, for example, be carried out in the pellicle frame attachment apparatus 857. For example, after use in the lithographic apparatus LA, a mask assembly 15 may be passed back to the pellicle frame attachment apparatus 857 using the mask assembly transport device 853 for pellicle assembly replacement in the pellicle frame attachment apparatus 857. The patterning device MA may be subjected to a cleaning process so as to remove contamination from the patterning device MA after the pellicle assembly 16 has been removed. The studs 51 may be removed from the patterning device MA before the patterning device is subjected to the cleaning process.

It will be noted that the patterned side of the patterning device MA is directed downwards during the various operations that are depicted in FIG. 2. Keeping the patterned side of the patterning device MA facing downwards is advantageous because this reduces the likelihood of a contamination particle being incident upon the pattern. Larger contamination particles tend to fall downwards due to gravity and thus will be incident upon the opposite side of the mask. Smaller contamination particles are less influenced by gravity and may instead be influenced by other transport physics. Apparatus of embodiments of the invention may include devices intended to address this. For example, the apparatus may include an ionizer to remove static charges and thereby reduce the risk of electrostatics causing particles to become attached to the pellicle.

Figure 3:
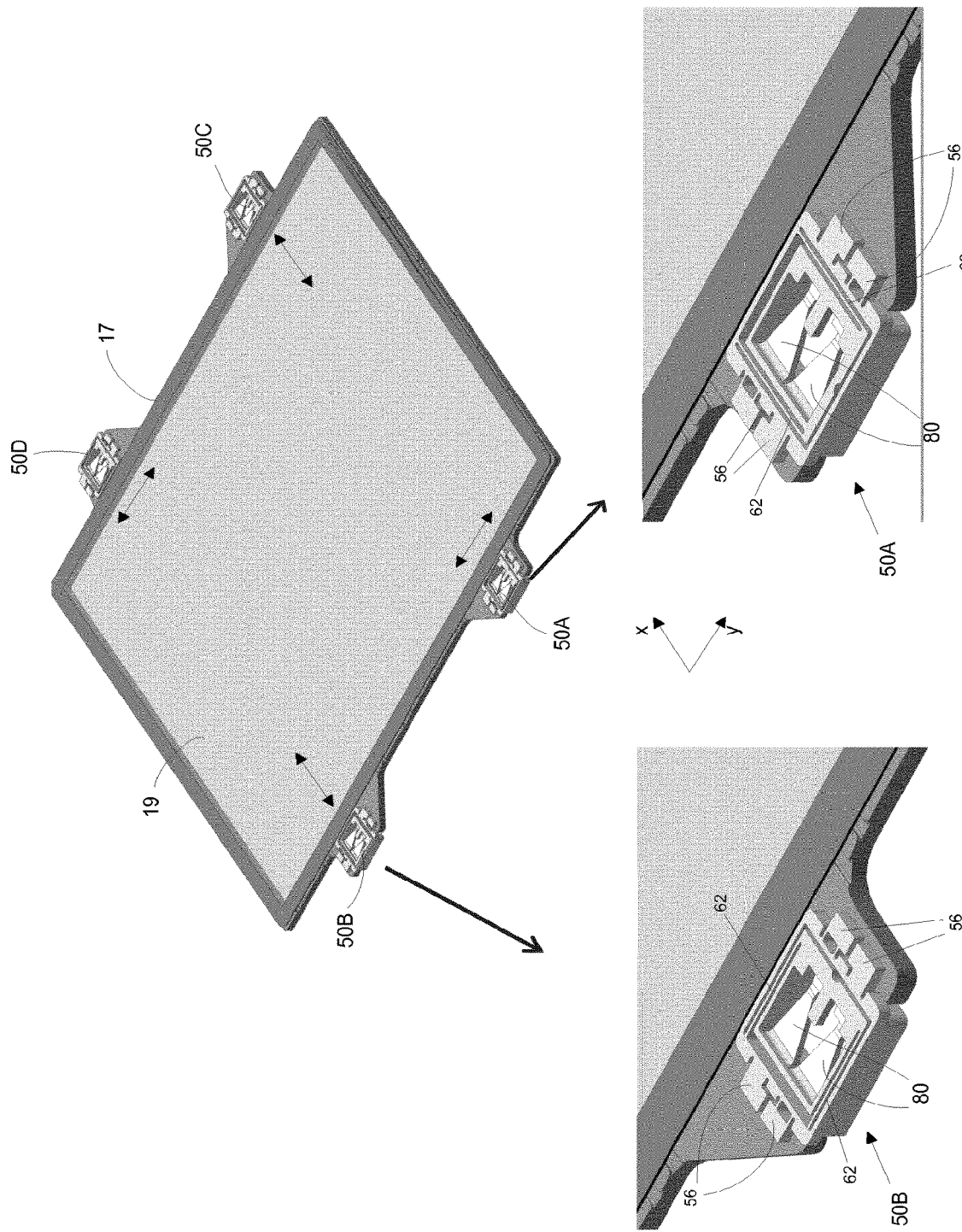
FIG. 3 is a perspective view a mask assembly according to an embodiment of the invention.
Figure 4:
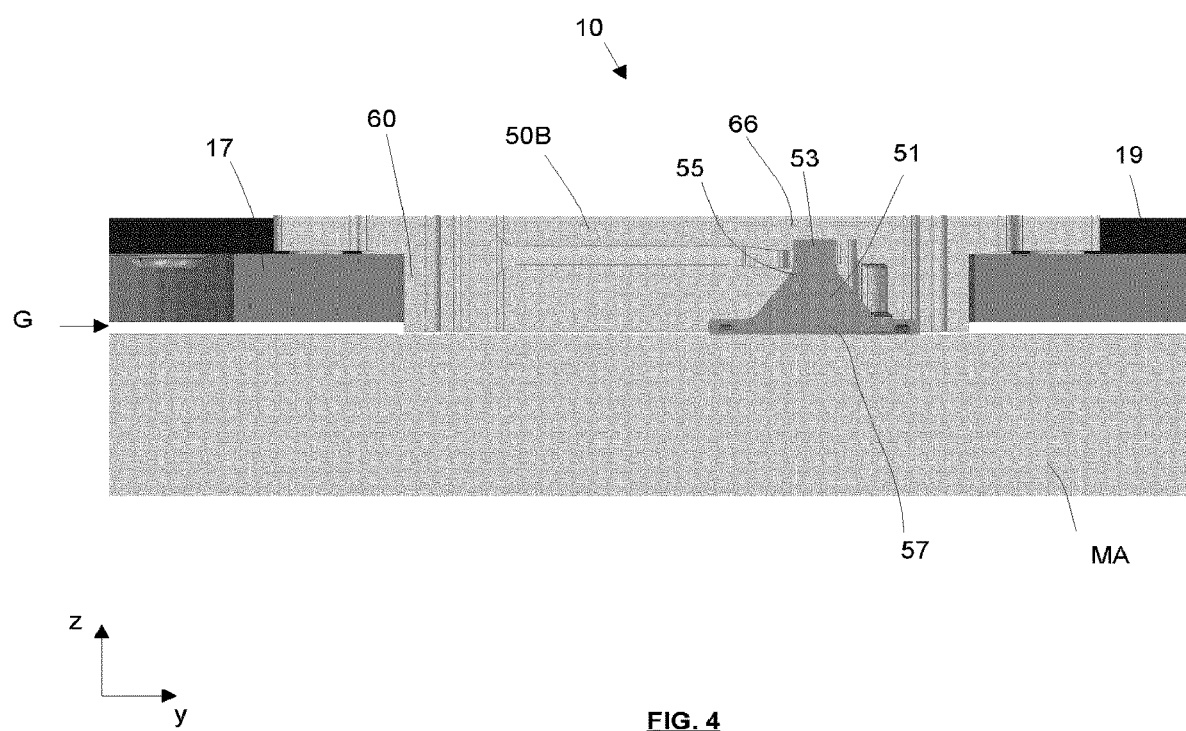
FIG. 4 is a cross sectional view of part of the mask assembly of FIG. 3.

A mask assembly according to an embodiment of the invention is illustrated in FIGS. 3-5. In this embodiment a pellicle frame and pellicle are suspended relative to a patterning device (e.g. a mask). The pellicle frame is releasably engageable with the patterning device. The releasable engagement is provided by a mount which comprises a plurality of sub-mounts (for example 2, 3, 4 or even more sub-mounts). The mount allows the pellicle frame (and pellicle) to be removed from the patterning device in an easy and convenient manner. The removal of the pellicle frame and pellicle from the patterning device may be clean, i.e. may generate substantially no contamination particles. Once the pellicle frame has been removed from the patterning device the patterning device may be inspected using an inspection tool (and may be cleaned if necessary). The pellicle frame and pellicle can subsequently be easily reattached to the patterning device or may be replaced with a new pellicle frame and pellicle.

Referring first to FIG. 3, a pellicle 19 is attached to a pellicle frame 17. The pellicle 19 may, for example, be glued to the pellicle frame 17. The pellicle frame 17 is provided with four engagement mechanisms 50A-D. Each engagement mechanism 50A-D is configured to receive a protrusion (which may for example be referred to as a stud) which extends from a patterning device (as described below in connection with FIG. 4). Two engagement mechanisms 50A,B are provided on one side of the pellicle frame 17 and two engagement mechanisms 50C,D are provided on an opposite side of the pellicle frame. Other combinations may also be possible, such as an engagement mechanism on each of the four frame sides etc. The engagement mechanisms are provided on sides of the pellicle frame 17 which will be oriented in the scanning direction during use in a lithographic apparatus (indicated in FIG. 3 as the y-direction in accordance with conventional notation). However, the engagement mechanisms may also be provided on sides of the pellicle frame 17 which will be oriented perpendicular to the scanning direction during use in a lithographic apparatus (indicated in FIG. 3 as the x-direction in accordance with conventional notation).

The protrusions which are received by the engagement mechanisms 50A-D may be located on the front surface of the patterning device. Additionally or alternatively, the protrusions may be located on sides of the patterning device. Protrusions may extend upwardly from sides of the patterning device. In such an arrangement the protrusions may each have a flattened lateral surface to facilitate secure bonding to a side of the patterning device.

FIG. 3 depicts four engagement mechanisms 50A-D secured to a pellicle frame 17. Two of the sub-mounts 50A,D are configured to allow for movement in the y-direction (i.e. provide flexibility or compliance in the y-direction). Two sub-mounts 50B,C are configured to allow for movement in the x-direction (i.e. provide flexibility or compliance in the x-direction). However, all four sub-mounts 50A-D are configured to allow engagement to be achieved between the sub-mounts and protrusions (not depicted) via movement in the y-direction and thus, as may be seen, all four sub-mounts include engagement arms 80 which extend in the y-direction. A possible disadvantage of this configuration is that sudden deceleration during a y-direction scanning movement could cause the engagement mechanisms 50A-D to slide out of attachment to the protrusions (due to inertia of the pellicle frame 17). This might occur for example if there is a 'crash' of the mask support structure MT (see FIG. 1). In an alternative arrangement, all four sub-mounts may include engagement arms which extend in the x-direction (i.e. the non-scanning direction). Having the engagement arms all extending in the non-scanning direction is advantageous because this avoids the possibility of a sudden y-direction deceleration causing disengagement of the engagement mechanisms. In general, the engagement arms of each sub-mount may all extend in substantially the same direction.

In order to allow movement/flexibility in the x-direction, arms 62 which support locking members of two of the sub-mounts 50B, C extend in the y-direction. These arms are resiliently flexible in the x-direction and thus provide movement/flexibility in the x-direction. Thus, engagement arms 80 of two of the sub-mounts 50B,C extend generally parallel to the arms 62 of that sub-mount. In order to allow movement/flexibility in the y-direction, arms 62 which support locking members of the other two sub-mounts 50A,D extend in the x-direction. These arms are resiliently flexible in the y-direction and thus provide movement/flexibility in the y-direction. Thus, engagement arms 80 of two of the sub-mounts 50A,D extend generally perpendicular to the arms 62 of that sub-mount. The movement/flexibility which is provided by the sub-mounts 50A-D allows flexing of the pellicle frame 17 relative to the patterning device MA as needed when temperature changes occur. This is advantageous because it avoids potentially damaging thermal stresses arising in the pellicle frame 17.

The sub-mounts 50A-D are depicted with tabs 56 which have a different configuration from the tabs 56 depicted in FIG. 5. However, the tabs provide the same function of facilitating engagement between the sub-mounts 50A-D and the pellicle frame 17. Any suitable configuration of tabs may be used.

FIG. 4 depicts in cross-section one engagement mechanism 50B along with a protrusion 51 which projects from a patterning device MA. The protrusion 51, which may be referred to as a stud, may for example be glued to the patterning device MA or may be attached by other bonding means (optical contacting, magnetic or van der Waals forces, etc). The engagement mechanism 50B and the protrusion 51 together form a sub-mount 10. The protrusion 51 comprises a distal head 53 located on a shaft 55 which extends from a base 57. The base 57 is fixed to the patterning device MA for example by using glue. The shaft 55 and distal head 53 may be cylindrical, or they may have any other suitable cross-sectional shape.

The sub-mount 10 suspends the pellicle frame 17 relative to the patterning device MA such that there is a gap G (which may be considered to be a slit) between the pellicle frame and the patterning device. The gap G may be maintained by engagement between a cap 66 of the engagement mechanism 50B and the distal head 53 of the protrusion 51 (or by some other movement limiting component). The gap G may be sufficiently wide to allow equalization of pressure between the exterior environment and the space between the pellicle and the patterning device. The gap G may also be sufficiently narrow that it provides a desired restriction of the potential route of contamination particles from the exterior environment to the space between the pellicle and the patterning device. The gap G may for example be at least 100 microns in order to allow equalization of pressure between the exterior environment and the space between the pellicle and the patterning device. The gap G may for example be less than 500 microns, more preferably less than 300 microns. The gap G may for example be between 200 microns and 300 microns.

Figure 5A:
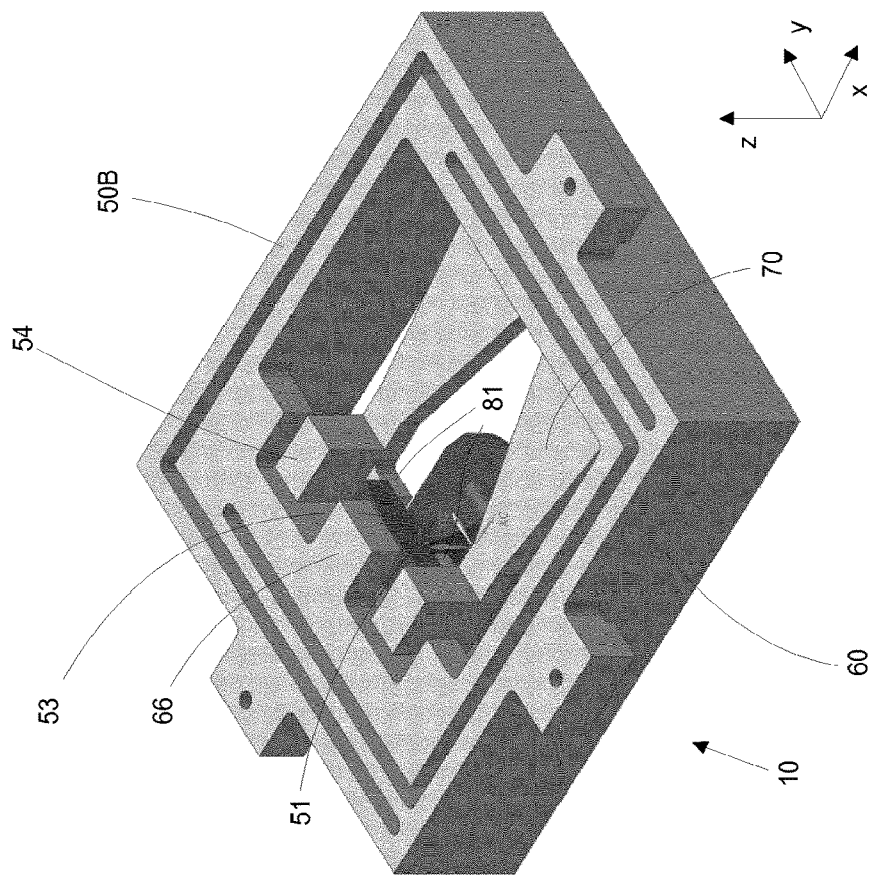
FIGS. 5A-5B depicts an engagement mechanism which forms part of the mask assembly of FIG. 3.
Figure 5B:
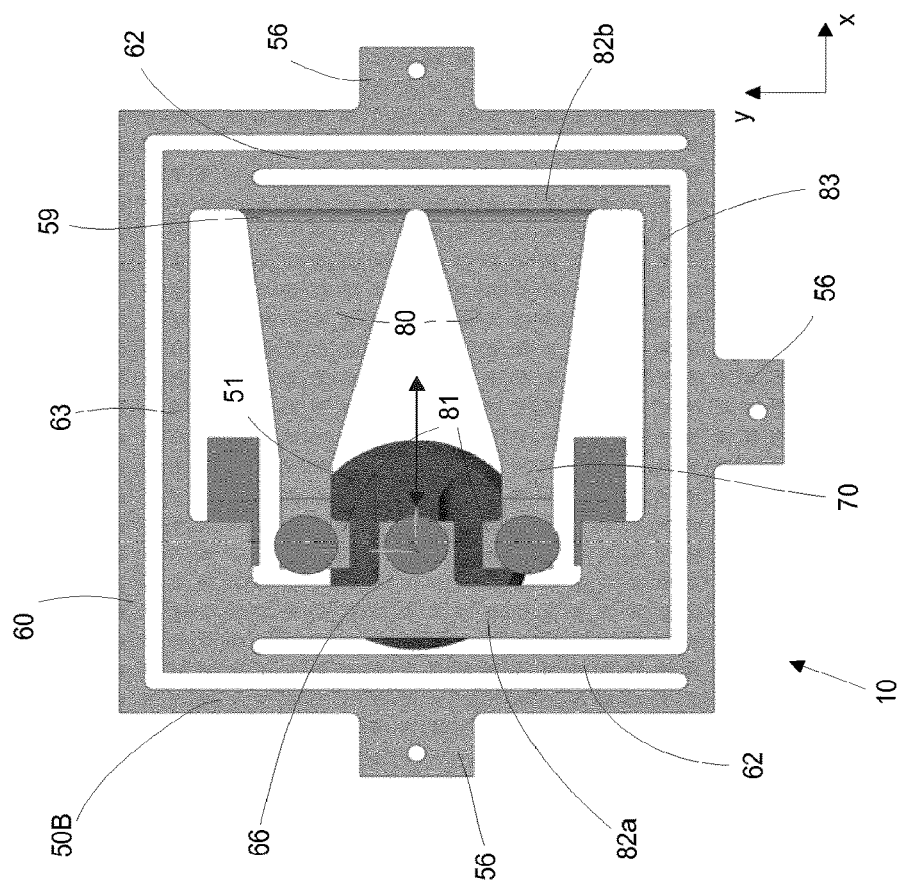

FIG. 5 depicts the sub-mount 10 of FIG. 4 in more detail. The pellicle frame attached to the engagement mechanism 50B is not depicted in FIG. 5. Similarly, the patterning device from which the protrusion 51 projects is not depicted in FIG. 5. FIG. 5A shows the sub-mount 10 viewed from below and FIG. 5B shows the sub-mount in a perspective view seen from below.

The engagement mechanism 50B comprises a rectangular outer wall 60 which is received in an opening in a pellicle frame (see FIG. 3). A pair of arms 62 extend in the y-direction across a space defined by the outer wall 60. A connecting member 63 extends between distal ends of the arms 62. The arms 62 are examples of resilient members. Other resilient members may be used. The arms 62 and connecting member 63 together form a generally U-shaped support. A locking member 70 is connected to a distal end of the generally U-shaped support. The locking member 70 engages with the protrusion 51 (which may be referred to as a stud) thereby securing the pellicle frame to the patterning device.

The locking member 70 comprises a pair of engagement arms 80 provided with engagement tabs 81 and further comprises a cap 66. As may be best seen in FIG. 5B, when the locking member 70 is engaged with the protrusion 51, the engagement tabs 81 press against an under-surface of a distal head 53 of the protrusion, and the cap 66 presses against an outer surface of the distal head 53. This pressing of the engagement tabs 81 and cap 66 against the distal head 53 of the protrusion 51 secures the engagement mechanism 50B to the protrusion to provide a secure sub-mount 10. This provides a secure connection between the pellicle frame and the patterning device.

The cap 66 and the engagement arms 80 extend from intermediate arms 82a,b. The intermediate arms 82a,b extend from the connecting member 63 and extend in the y-direction back across a space generally defined by the outer wall 60. A connecting member 83 extends between the intermediate arms 82a,b. The intermediate arms 82a,b and connecting member 83 together form a generally U-shaped support.

Thus, a first generally U-shaped support formed by arms 62 and connecting member 63 extends in the y-direction across the space generally defined by the outer wall 60, and a second U-shaped support formed by support arms 82a,b and connecting member 83 extends back across that space.

The arms 62 which form the first generally U-shaped support have some flexibility in the x-direction, and this allows some movement in the x-direction of the locking member 70. Thus the sub-mount 10 allows some movement in the x-direction of a pellicle frame relative to a patterning device at the location of that sub-mount. The arms 62 are formed from resilient material and therefore tend to return to their original orientations. The sub-mount 10 may be considered to be a kinematic sub-mount. The arms 62 are significantly thicker in the z-direction than in the x-direction (as may best be seen in FIG. 5B), and as a result significantly less bending of the arms in the z-direction is possible compared with bending of the arms in the x-direction. Since the arms extend in the y-direction, they do not provide for significant movement in the y-direction. The arms 62 may thus prevent or substantially prevent local movement of a pellicle frame in the y and z-directions whilst allowing some movement in the x-direction.

The cap 66 extends from the first support arm 82a, and engagement arms 80 extend from the second support arm 82b. The first support arm 82a is significantly thicker in the x-direction than the arms 62, and thus does allow significant movement in the x-direction relative to the arms 62. The second support arm 82b has a similar thickness to the arms 62 in the x-direction, but the connecting member 83 which extends between the intermediate arms 82a,b inhibits movement of the second support arm 82b in the x-direction because such movement can only occur if the first support arm 82a also moves.

The engagement arms 80 extend from the second support arm 82b in the general direction of the cap 66. Proximal ends of the engagement arms 80 extend along the majority of the second support arm 82b (thereby substantially preventing the engagement arms 80 from flexing in directions which are generally parallel to a patterned surface of the patterning device). The engagement arms 80 taper as they extend in the general direction of the cap 66. Engagement tabs 81 extend inwardly from distal ends of the engagement arms 80 to engage with an under-surface of a distal head 53 of the protrusion 51. Blocks 54 are provided above the engagement tabs 81 and provide actuator receiving surfaces as is explained further below. The engagement arms 80 are resiliently deformable in the z-direction. The engagement arms 80 may be sufficiently thin that they bend in the z-direction. Additionally or alternatively, some bending in the z-direction of the engagement arms 80 may be facilitated by a groove 59 which extends in the y-direction at the point where the engagement arms 80 connect to the support arm 82b.

Tabs 56 extend outwardly from the outer wall 60. The tabs may be used to secure the engagement mechanism 50B to a pellicle frame. This is depicted in FIG. 3 but with a different configuration of tabs.

Figure 6:
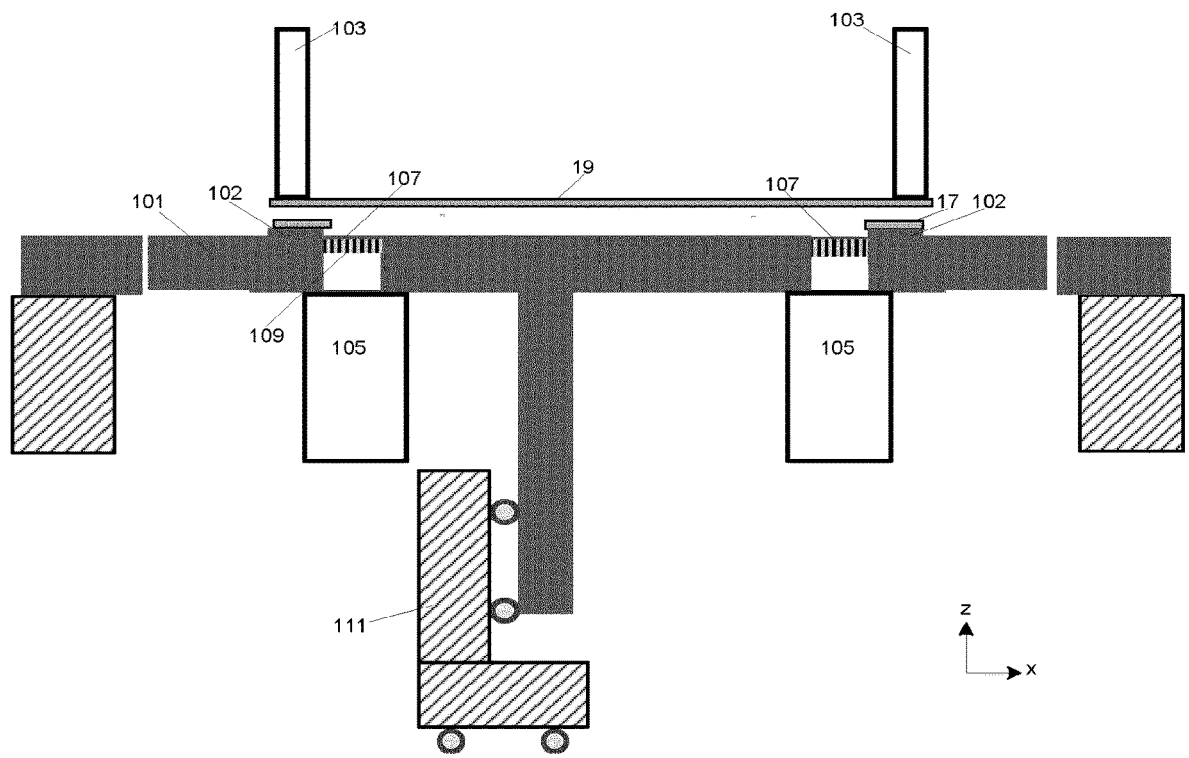
FIG. 6 schematically depicts a pellicle attachment apparatus according to an embodiment of the invention.

FIG. 6 schematically depicts in cross section a pellicle attachment apparatus 855 which may be used to attach the pellicle 19 to the pellicle frame 17. The pellicle attachment apparatus 855 may correspond with the pellicle attachment apparatus depicted in FIG. 2. The pellicle frame 17 is supported by a support structure 101. The support structure 101 includes a raised portion 102 upon which the pellicle frame 17 rests. The pellicle 19 is held by support arms 103 which project downwardly from a frame (not depicted). Imaging sensors 105 (e.g. cameras) are provided beneath the support structure 101 and look through windows 107 which are provided in an upper surface of the support structure. Alignment marks 109 are provided on the windows. The alignment marks 109 allow the imaging sensors 105 to determine the position of both the frame 17 and the pellicle 19 (as discussed below in connection with FIG. 7). Actuators 111 are connected to the support structure 101 and are operable to move the support structure 101 relative to a base (not depicted). The actuators 111 are configured to move the support structure 101 in the x, y and z directions (in this document x and y may indicate two orthogonal horizontal directions, and z may indicate the vertical direction). The actuators are also configured to rotate the support structure 101 about the z-axis. The actuators 111 allow the support structure 101 to be moved in order to position the frame 17 relative to the pellicle 19 before the pellicle is attached to the frame.

Figure 7:
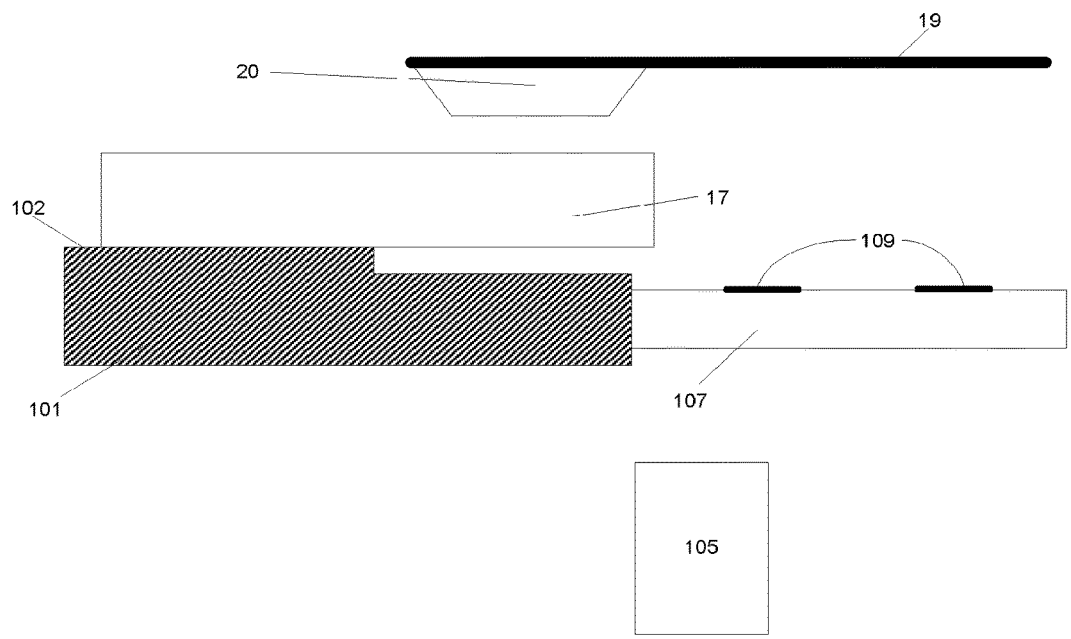
FIG. 7 depicts parts of the pellicle attachment apparatus in more detail.

FIG. 7 schematically depicts part of the pellicle attachment apparatus of FIG. 6 in more detail, including the pellicle 19 and pellicle frame 17. The relative positions of the imaging sensor 105, window 107, pellicle frame 17 and pellicle 19 can be seen in FIG. 7. The pellicle frame 17 partially projects over the window 107, and as a result the edge of the frame 17 is visible to the imaging sensor 105. This allows the position of the frame 17 to be accurately determined relative to the alignment marks 109 provided on the window 107. The pellicle 19 has a border 20 around its outer perimeter which is significantly thicker than the main portion of the pellicle 19. It is this border 20 which is attached to the pellicle frame 17. In addition it is this border 20 which is handled by the support arms 103 (depicted in FIG. 6). As may be seen from FIG. 7, the border 20 projects beyond an inner edge of the frame 17, and thus an inner edge of the border is visible to the imaging sensor 105. This allows the border 20 (and thus the pellicle 19 in general) to be accurately positioned relative to the alignment marks 109 in the window 107. This in turn allows the border 20 (and pellicle) to be accurately positioned relative to the frame 17 (since the frame is accurately positioned relative to the alignment marks 109 in the window 107).

The imaging sensor 105 and window 107 may be located at a corner position in the support structure 101, i.e. a position where a corner of the frame 17 is located in use. Imaging sensors 105 may be located at opposite corner positions. By seeing opposite corners of the frame 17 the imaging sensors 105 allow the position of the frame to be determined accurately.

Figure 8:
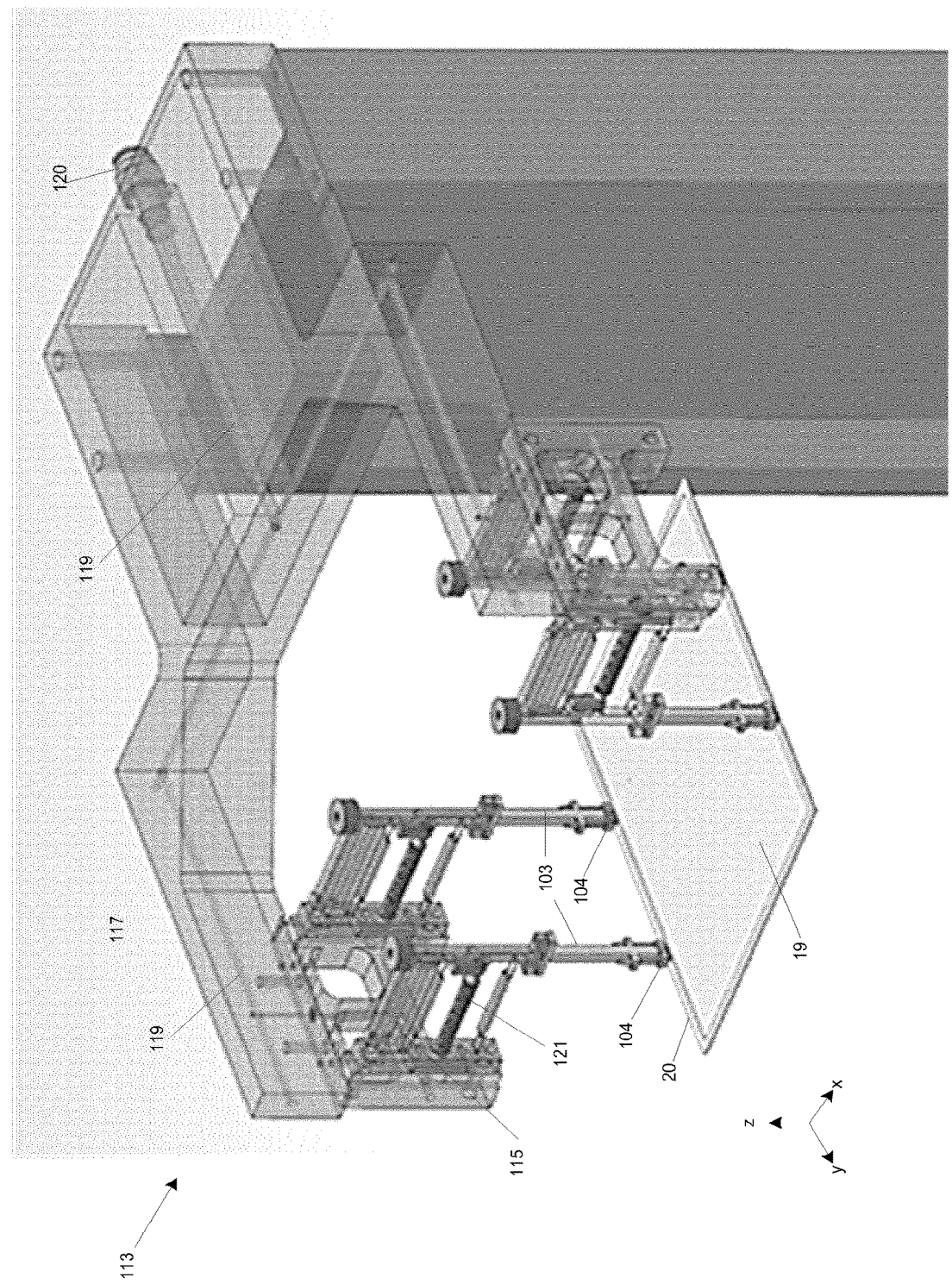
FIG. 8 depicts in perspective view a handling system according to an embodiment of the invention.

FIG. 8 is a perspective view of a handling system 113 which may be used to handle the pellicle 19. A handling system with the same configuration may also be used to handle the pellicle frame 17.

Support arms 103 of the handling system 113 hold the border 20 of the pellicle 19. The support arms are connected by connector arms 115 to a handling system frame 117. The handling system frame 117 is fixed in the x and y directions but is moveable in the z direction. A vacuum source (not depicted) is connected to a conduit 119 of the handling system frame via a port 120. The conduit 119 splits into two and travels along each arm of the handling system frame 117. Each support arm 103 contains a conduit (not depicted) which terminates at an opening provided in a foot 104 at the bottom of that support arm. Each conduit is connected via bellows 121 to the conduit 119 in the handling system frame 117. In this way, a vacuum which is applied at the port 120 is connected via the conduit 119 and the bellows 121 to the openings in the feet 104 of the support arms 103. When the vacuum is applied it sucks the border 20 of the pellicle 19 towards the foot 104 of each support arm 103 and thus secures the border 20 to the support arms. Each foot 104 is dimensioned to receive the border 20 of the pellicle 19 (e.g. has a width which corresponds with the width of the border). When the vacuum is removed the border 20 is no longer sucked towards the feet 104 of the support arms 103 but instead is released from the support arms.

Figure 9:
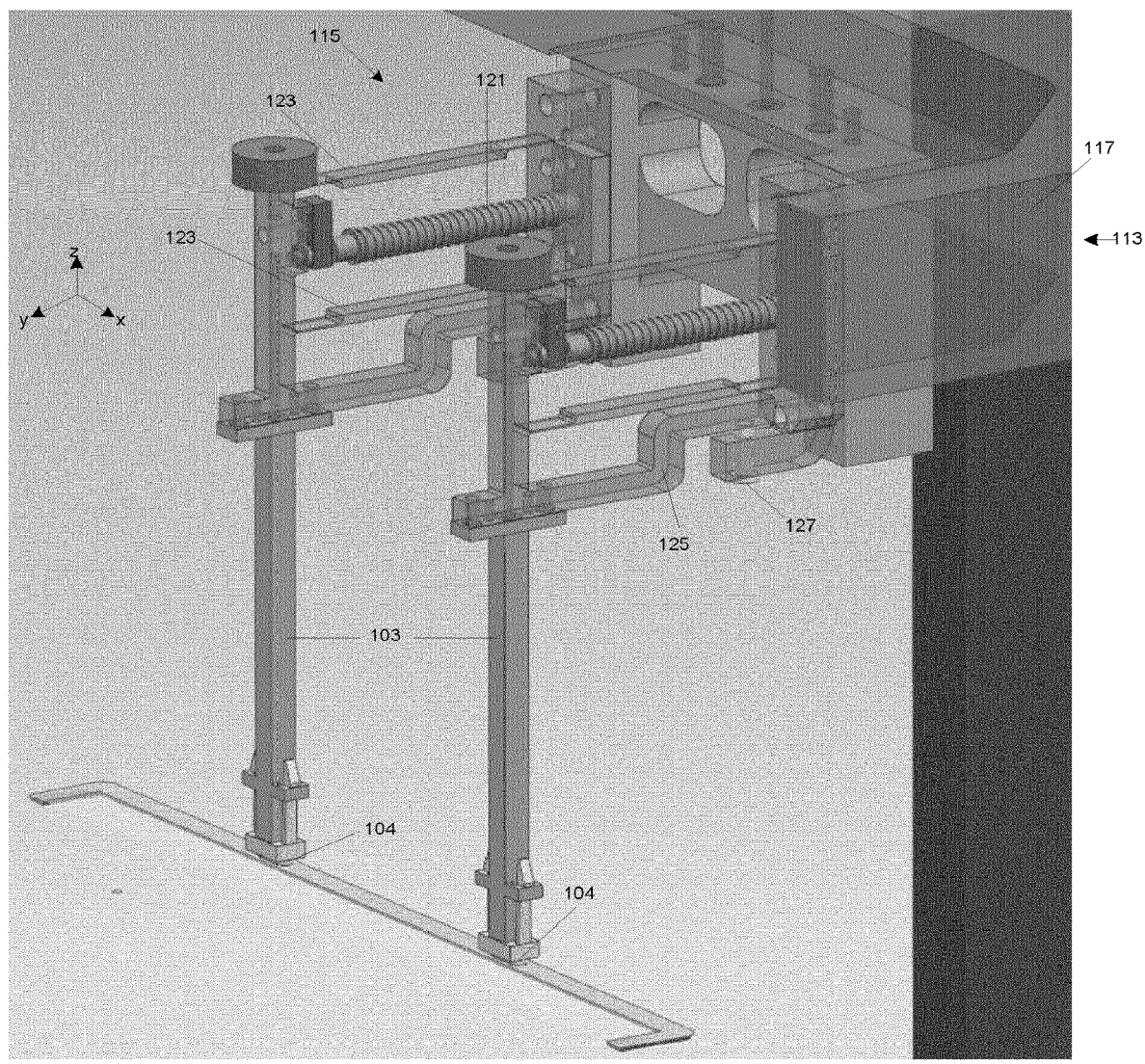
FIG. 9 depicts part of the handling system of FIG. 8 in more detail.

FIG. 9 is a perspective view of part of the handling system 113 in more detail, although with connector arms 115 which have a modified configuration compared with those depicted in FIG. 8. Each connector arm 115 comprises a pair of leaf springs 123, the leaf springs extending from the handling system frame 117 to a support arm 103. The leaf springs 123 provide flexibility in the z-direction (i.e. vertical) but provide little or no flexibility in the x and y directions. This is achieved by the leaf spring being significantly thinner in the z-direction than it is in the x and y directions. The bellows 121 which are used to communicate the vacuum to the support arms 103 are flexible and thus permit relative movement of the support arms 103 relative to the handling system frame 117.

Movement limiting arms 125 project from the support arms 103 towards the handling system frame 117. Adjustable end stops 127 (e.g. bolts held in threaded bores) are fixed to the handling system frame 117. The adjustable end stops 127 limit downward movement of the movement limiting arms 125 (i.e. movement in the minus z direction). The adjustable end stops 127 thus prevent downward movement of the pellicle 19 beyond a predetermined position.

When a pellicle is to be attached to a pellicle frame, in a first step a handling system is used to pick up the frame. The handling system (not depicted) may be generally the same as the handling system described above in connection with FIGS. 8 and 9. The foot at the bottom of each support arm may have a size and shape which corresponds with a portion of the frame that will come into contact with the foot.

Once the pellicle frame 17 has been lifted by the handling system, the support structure 101 is positioned beneath the pellicle frame. The pellicle frame 17 is lowered until it is a few millimetres above the support structure 101. Referring again to FIGS. 6 and 7, the support structure 101 is then moved using the actuators 111 until it is accurately positioned relative to the pellicle frame 17 (as determined using the imaging detectors 105). The pellicle frame 17 is then lowered onto the support structure 101. The vacuum holding the pellicle frame 17 to the handling system is then released and the handling system is moved away from the pellicle frame 17. Glue is then provided on the pellicle frame 17. The glue may be provided at spaced apart locations around the frame (rather than providing glue which extends in a line around the frame).

The pellicle 19 is lifted by the handling system 113 as described above. The support structure 101 (together with the frame 17) is then positioned beneath the pellicle 19. The pellicle 19 is lowered using the handling system 113 until it is a few millimetres above the support structure 101. The support structure 101 is then moved using the actuators 111 until it is accurately positioned relative to the pellicle border 20. The pellicle is then lowered onto the pellicle frame. Once the pellicle 19 has been located on the frame 17 the vacuum is released from the support arms 103, and the support arms 103 are moved away from the pellicle 19.

Figure 10:
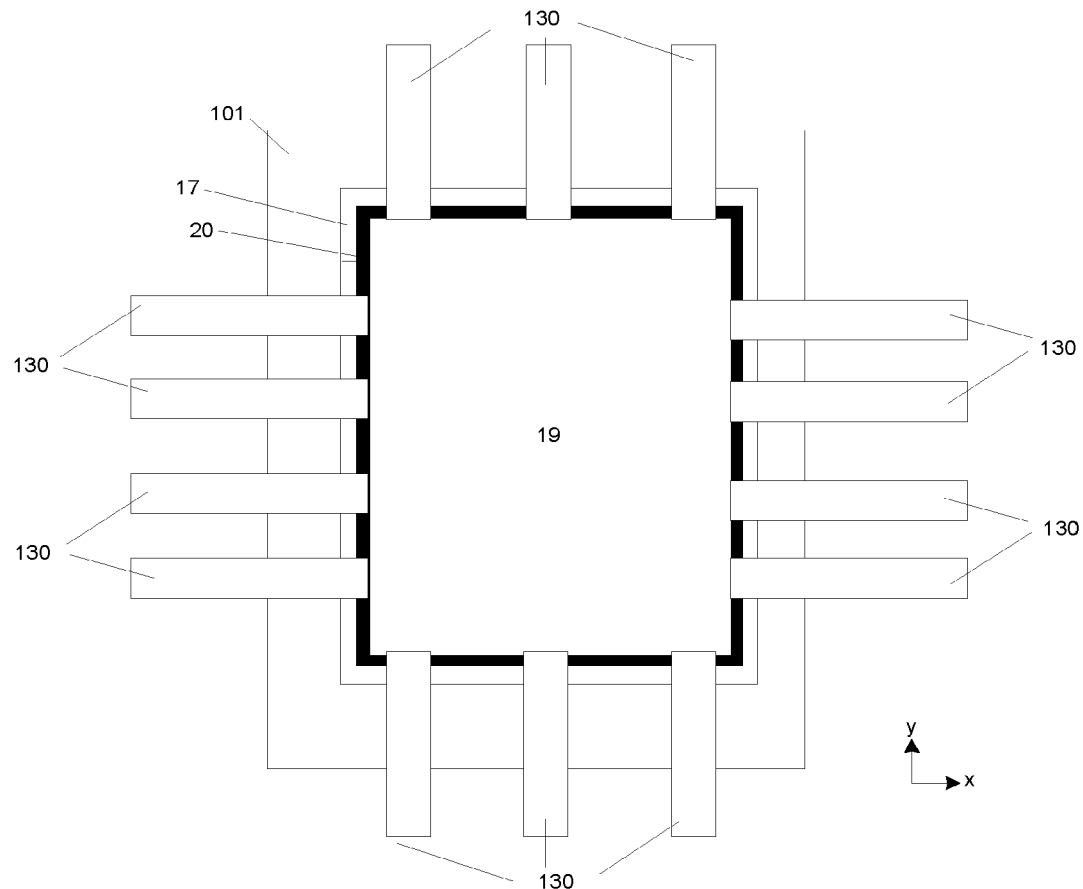
FIG. 10 schematically depicts part of the pellicle attachment apparatus viewed from above.

FIG. 10 schematically depicts from above the pellicle 19 in position on the pellicle frame 17 which in turn is held on the support structure 101. FIG. 10 schematically depicts arms 130 which apply downward pressure to the pellicle border 20 thereby holding the pellicle in place on the frame 17 whilst curing of the glue attaching the pellicle to the pellicle frame 17 takes place. The glue may be provided at spaced apart locations on the pellicle frame 17, and the arms 130 may be positioned to apply pressure at the locations at which glue has been provided.

Figure 11:
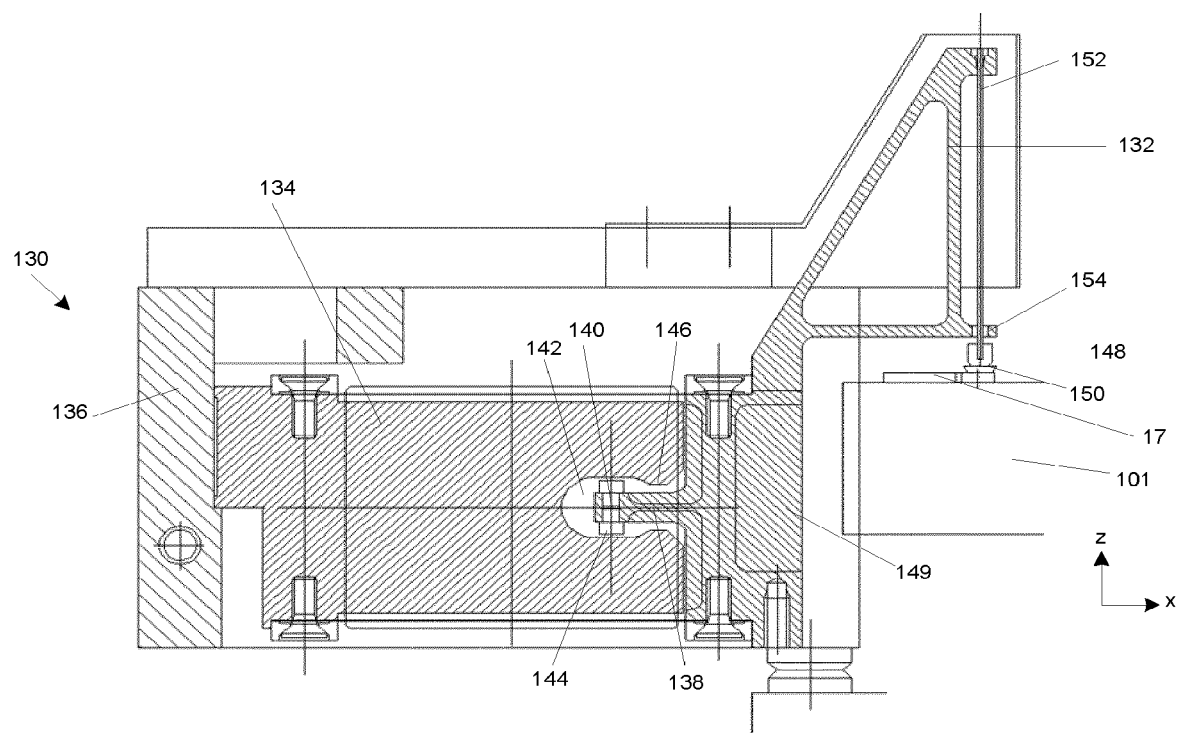
FIG. 11 depicts an arm of the pellicle attachment apparatus in cross-section.

FIG. 11 depicts one of the arms 130 in cross-section. The arm 130 comprises a weighted portion 132 which is connected to a support portion 134 that extends from a support frame 136. The weighted portion 132 includes a projection 138 which is provided with a vertical bore 140. The projection 138 projects into an opening 142 in the support portion 134. A pin 144 extends from the top to the bottom of the opening 142 and passes through the bore 140. Because the pin 144 and bore 140 are both oriented in a vertical direction (the z direction), the pin and bore arrangement allows some vertical (or generally vertical) movement of the weighted portion 132 relative to the support portion 134 of the arm 130. The range of vertical movement of the weighted portion 132 relative to the support portion 134 is limited by end stops 146 provided at the mouth of the opening 142. The end stops are arranged to contact with the projection 138 and thereby prevent further vertical movement of the weighted portion 132.

A finger 148 extends downwardly from the weighted portion 132 of the arm 130. A cap 150 is provided at a bottom end of the finger 148. The cap 150 may have a lowermost surface which generally corresponds in size with (or is larger than) an area of glue provided on the pellicle frame 17. The finger 148 comprises a vertical rod 152 which is secured at an uppermost end to the weighted portion 132 of the arm 130. The vertical rod 152 extends downwardly and passes through an opening 154 provided in the weighted portion 132. The opening 154 is significantly wider than the rod 152 and thus permits some lateral movement of the bottom end of the rod to take place (and thus lateral movement of the end of the finger). This is advantageous because it allows the cap 150 to rest upon the border 20 of the pellicle 19 without applying significant lateral forces to the pellicle (as could occur if the rod 152 was not free to move in a lateral direction relative to the weighted portion 132 of the arm 130).

In use, the support frame 136 holds the arms 130 away from the pellicle 19 until the arms are needed. The support frame 136 then moves the arms 130 downwards until a downwardly projecting finger 148 of the arm comes into contact with the border 20 of the pellicle 19. Downward motion of the support frame 136 ceases before the projection 138 of the weighted portion 132 comes into contact with an upper end stop 146 of the support portion 134. Thus, the weighted portion 132 rests upon the border 20, pressing on the border 20 via the finger 146, and is not supported by the support frame 136.

The downward pressure exerted on the border 20 by the weighted portion 132 is determined by the weight of the weighted portion. The weighted portion 132 may thus be constructed to have a desired weight in order to apply a desired pressure to the border 20. The weighted portion 132 may include a weight receiving recess 149 into which a weight may be placed. The weighted portion 132 may include any suitable weight receiving receptacle or projection.

Referring again to FIG. 10, the arms 130 are used to apply pressure at desired locations around the border 20 of the pellicle 19. The weighted portions 132 of the arms are left in place for a period of time sufficient to allow some curing of the glue between the frame 17 and the border 20 to take place. The support frame 136 is then moved upwards in order to remove the weighted arms 132 from the border 20. The frame 17 and pellicle 19 (which together may be referred to as a pellicle assembly 16) may then be transferred to an oven in order to further cure the glue.

Figure 12:
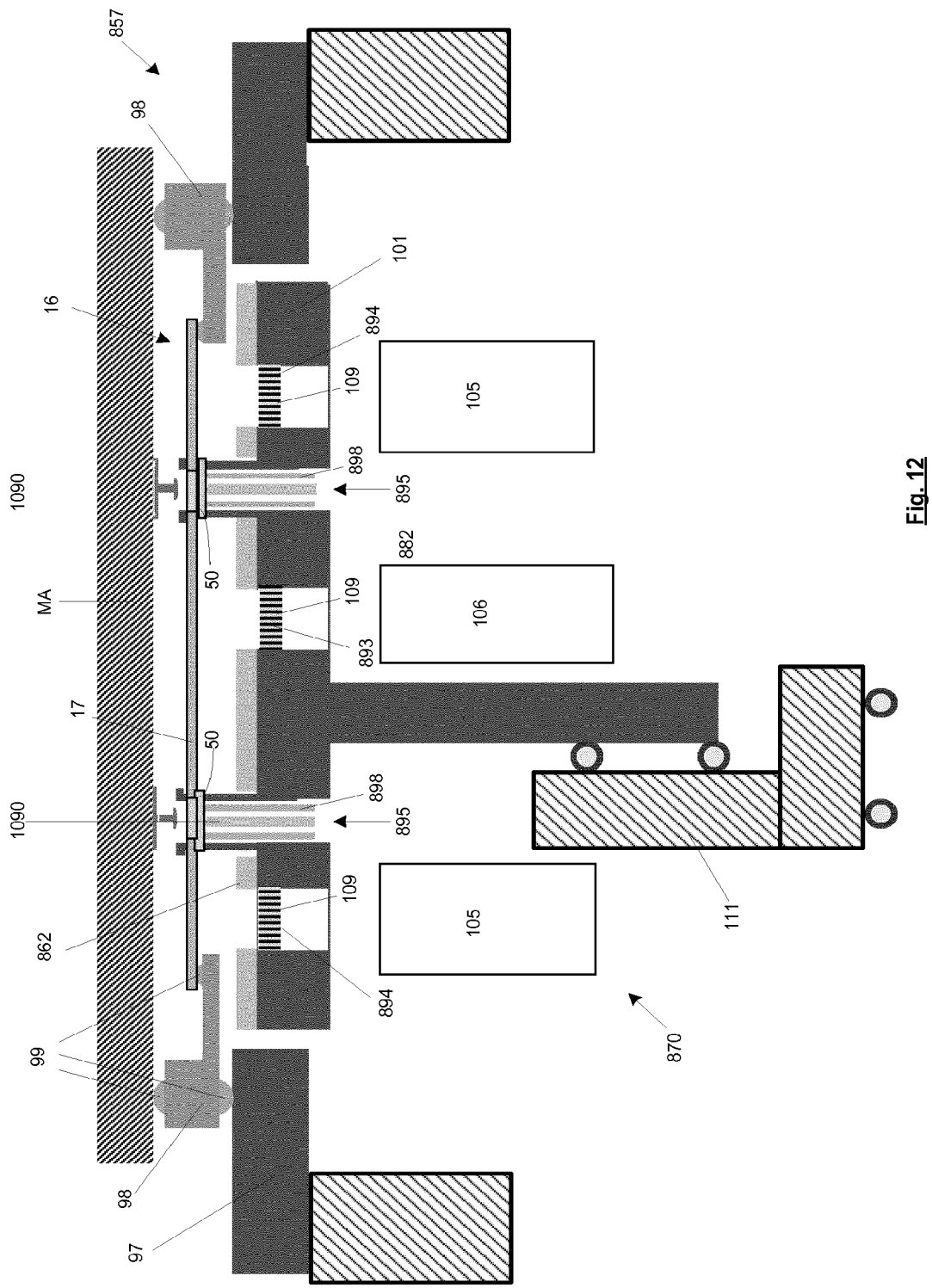
FIG. 12 schematically depicts a pellicle frame attachment apparatus according to an embodiment of the invention.
Figure 13:
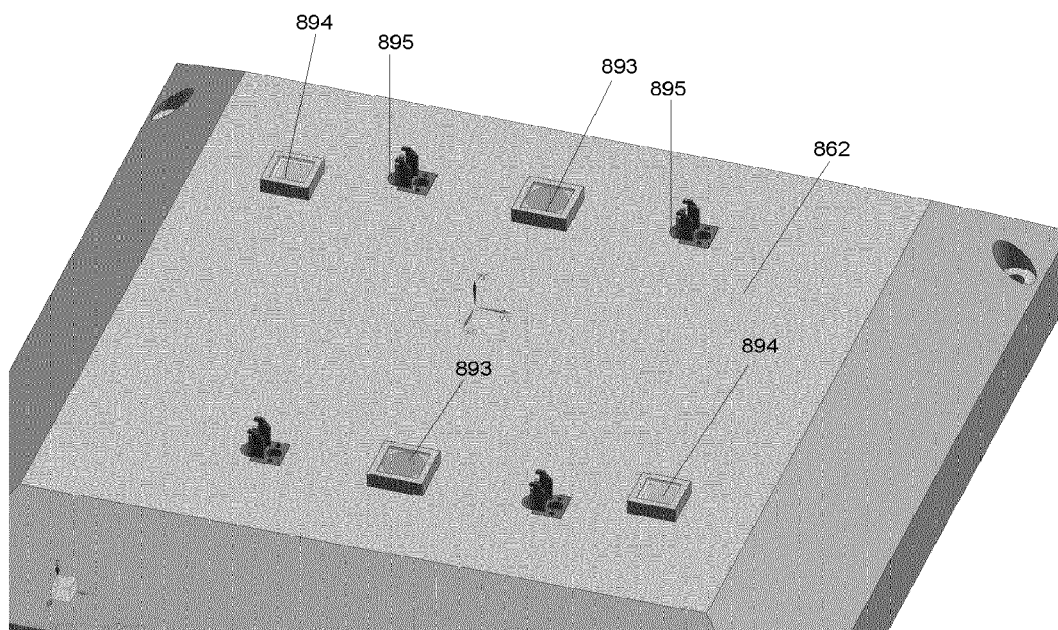
FIG. 13 is a perspective view of part of the pellicle frame attachment apparatus.
Figure 14:
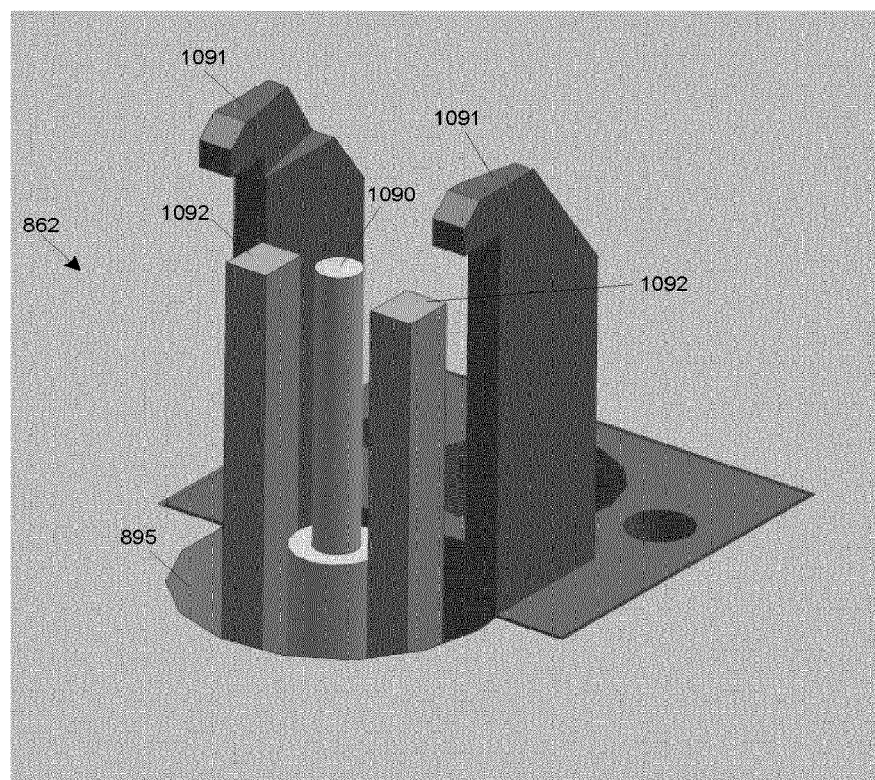
FIG. 14 shows part of pellicle frame attachment apparatus in greater detail.
Figure 15:
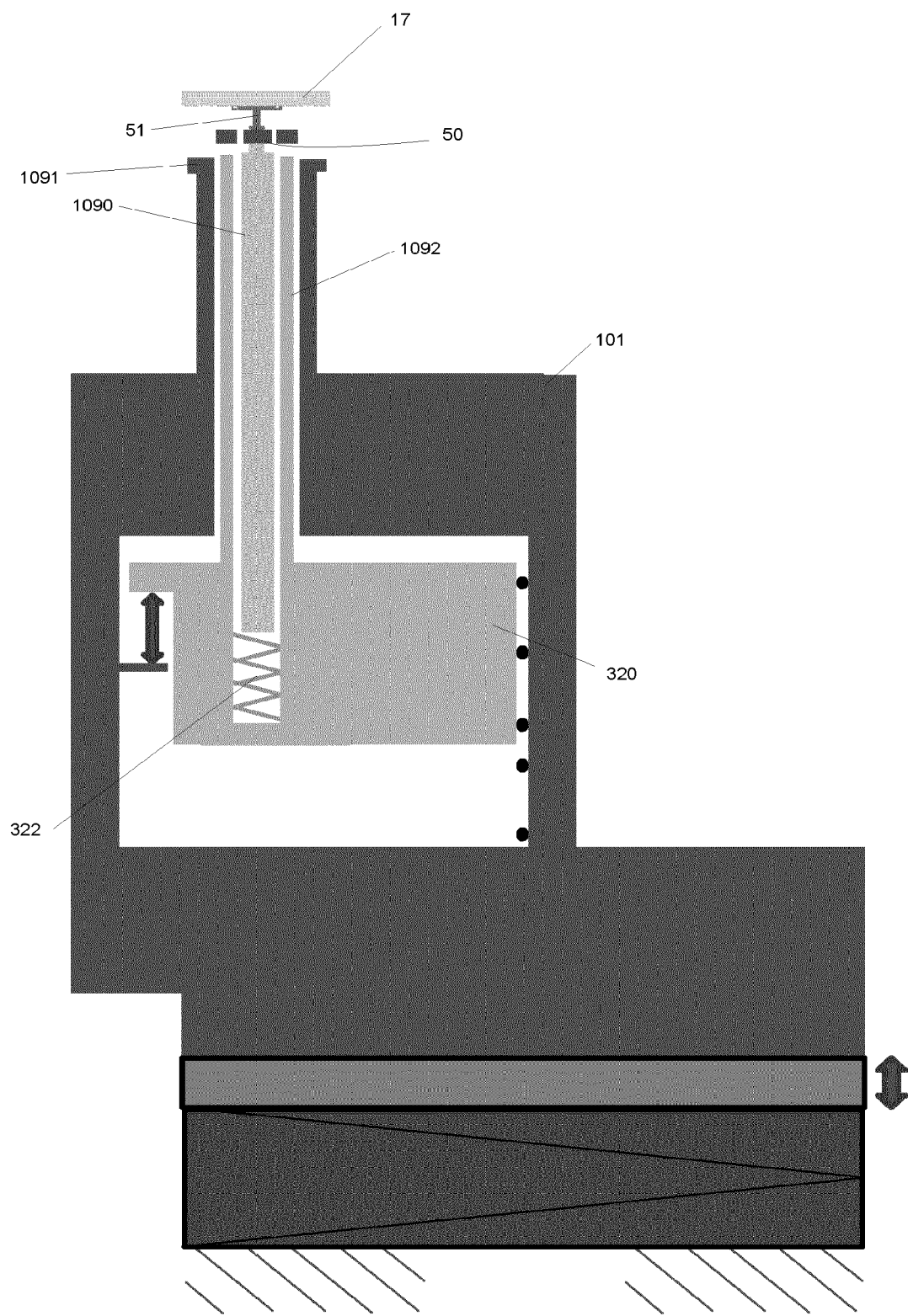
FIG. 15 schematically depicts an interrelationship between different parts of the pellicle frame attachment apparatus.

An embodiment of a pellicle frame attachment apparatus 857 is depicted in FIGS. 12-15. The pellicle frame attachment apparatus 857 may correspond with the pellicle frame attachment apparatus shown in FIG. 2. FIG. 12 schematically shows the pellicle frame attachment apparatus 857 in cross-section. FIG. 13 shows a partition 862 of the pellicle frame attachment apparatus 857 viewed from above. FIG. 14 is a perspective view of a pin 1090, hooked members 1091 and manipulator pins 1092 of the pellicle frame attachment apparatus, which may collectively be referred to as manipulators. The manipulators project through a hole 895 in the partition 862. FIG. 15 schematically depicts the manner in which the pins 1090, hooked members 1091 and manipulator pins 1092 are capable of moving relative to each other.

Referring first to FIG. 12, a pellicle assembly 16 comprises a patterning device MA provided with a pellicle frame 17 and a pellicle (not depicted). The frame 17 is provided with four engagement mechanisms 50 which correspond with the engagement mechanisms described further above in connection with FIGS. 3 to 5. Pins 1090 of the pellicle frame attachment apparatus 857 project through holes 895 in a partition 862. The partition 862 may correspond with, or be located on top of, a support structure 101. The support structure 101 may be the same as the support structure 101 which forms part of the pellicle attachment apparatus (see FIG. 6). Alternatively, the support structure 101 may be different from but may, optionally, have features in common with the support structure 101 which forms part of the pellicle attachment apparatus. Windows 893, 894 are located in the support structure 101, and imaging sensors 105, 106 are located beneath the windows. Alignment marks 109 are provided on the windows 893, 894.

An additional support structure 97 is provided at an outer perimeter of the pellicle frame attachment apparatus 857. The additional support structure may have a fixed position (as depicted), and is referred to herein as the fixed support structure 97. An intermediate support structure 98 is provided on top of the fixed support structure 97. The intermediate support structure 98 extends inwardly from the fixed support structure 97 as depicted. The intermediate support structure 98 supports both the pellicle frame 17 and the patterning device MA prior to attachment of the pellicle frame to the patterning device. Contacts 99 between the intermediate support structure 98 and other entities may for example be kinematic connections. The contacts 99 may be provided with a coating of PEEK.

The pellicle frame attachment apparatus 857 includes actuators 111 which may be used to adjust the position of the pellicle assembly 16 in the x, y and z directions and to rotate the pellicle assembly about the z direction. Two imaging sensors 105 (e.g. cameras), are positioned to view portions of the pellicle (e.g. corners of a border of the pellicle). Two other imaging sensors 106 (only one of which is depicted in FIG. 12) are positioned to view alignment marks provided on the patterning device MA (which may be a patterning device MA). Alignment of two entities using alignment marks is well-known in the art and is not described further here. The actuators 111 and the imaging sensors 105, 106 may collectively be referred to as a control system 870.

A gas outlet (not depicted) may be configured to supply gas on the pellicle frame 17 side of the partition 862. The gas may be delivered at a pressure which is higher than a gas pressure on an opposite side of the partition.

FIG. 13 depicts the partition 862 in more detail. As may be seen, the partition 862 is provided with four windows. Two of the windows 893 are positioned to allow the imaging sensors 106 to view alignment marks provided on the patterning device MA. The other two windows 894 are positioned to allow the imaging sensors 105 to view the pellicle frame 17 (e.g. to view corners of the pellicle frame). The windows 893, 894 may for example be formed from quartz.

The partition 862 is further provided with holes 895, the holes being positioned to correspond with the positions of engagement mechanisms 50 of the pellicle assembly 16. One of the holes 895 is depicted in more detail in FIG. 14. The hole 895 is dimensioned to allow a pin 1090 and manipulator pins 1092 to project through the hole. hooked members 1091 project from sides of the hole. In other words, the hooked members 1091 are fixed to the partition 862 and project from the partition. The pin 1090, hooked members 1091 and manipulator pins 1092 are also depicted in FIGS. 12, 13 and 15.

In use, the pellicle assembly 16 is loaded onto the pellicle frame attachment apparatus 857. It may be transferred to the pellicle frame attachment apparatus 857 without exposing it to contamination. For example, the pellicle assembly transport device 881 may be received in a load lock (not depicted) within the pellicle frame attachment apparatus 857, and the pellicle assembly 16 may be removed from the transport device within the load lock. The pellicle assembly 16 may then be transferred to the controlled environment 857 above the partition 862.

In an embodiment, the pellicle assembly 16 may be manually positioned relative to the pellicle frame attachment apparatus 857, for example using a handling system as depicted in FIG. 8. The pellicle assembly 16 is then placed onto the intermediate support structure 98.

The patterning device MA (with studs 51) may be transferred to the pellicle frame attachment apparatus 857 without exposing it to contamination. For example, the mask transport device 881 may be received in a load lock (not depicted) within the pellicle frame attachment apparatus 857, and the patterning device MA may be removed from the transport device within the load lock. The patterning device MA may then be transferred to the controlled environment 857 above the partition 862. In an embodiment, the patterning device MA may be manually positioned relative to the pellicle frame attachment apparatus 857, for example using a handling system generally as depicted in FIG. 8. The patterning device is then placed onto the intermediate support structure 98.

As noted further above, the controlled environment 859 above the partition 862 may be held at a pressure higher than the pressure beneath the partition (e.g. by delivering gas above the partition). As will be appreciated from FIGS. 12 to 15, the openings 895 in the partition 862 are relatively small, thus limiting the likelihood of contamination passing through the openings into the controlled environment. This likelihood is further reduced by the higher pressure of the controlled environment 859 with respect to the environment in the feed partition 862. The higher pressure ensures that air flows downwards through the holes 895, thereby carrying contamination away from the pellicle 19.

When securing the pellicle assembly 16 to the patterning device MA, the imaging sensors 105, 106 are used to monitor the positions of the pellicle assembly relative to the patterning device MA. This occurs after the pellicle frame 17 has been lifted from the intermediate support structure 98 by the pins 1090. The position of the pellicle frame 17 is adjusted using the actuators 111. This moves the support structure 101 and thus moves the pellicle frame 17 relative to the patterning device MA. Operation of the actuators 111 may be manual, or may be controlled by an automated controller. The movement of the support structure 101 may continue until the pellicle frame 17 is aligned relative to the patterning device MA.

Once the pellicle frame 17 has been correctly positioned relative to the patterning device MA, the pins 1090, hooked members 1091 and manipulator pins 1092 are used to engage the engagement mechanisms 50 to the studs 51 which project from the patterning device MA.

The manner in which the pins 1090, hooked members 1091 and manipulator pins 1092 are capable of moving relative to each other is schematically illustrated in FIG. 15. As mentioned above, the hooked members extend from the support structure 101 and thus are not capable of movement relative to the support structure. The support structure itself 101 may be moved, as explained above, including movement in a generally vertical direction (z-direction). The manipulator pins 1092 are moveable in a generally vertical direction (z-direction) by an actuator 320. The manipulator pins 1092 are both fixed to the actuator 320 and thus both move together. The pin 1090 which supports the pellicle frame 17 is not actively moveable relative to the manipulator pins 1092. The pin 1090 is connected via a spring 322 to the actuator 320. As a result, upward and downward movement of the actuator 320 will cause corresponding movement of the pin 1090 unless the pin is in contact with the pellicle frame 17. If the pin 1090 is in contact with the pellicle frame 17 then further upward movement of the actuator 320 will not cause further upward movement of the pin but will instead cause compression of the spring 322. Once the spring 322 has been compressed, downward movement of the actuator 320 won't cause downward movement of the pin 1090 until the spring 322 has expanded to a relaxed configuration.

Figure 16:
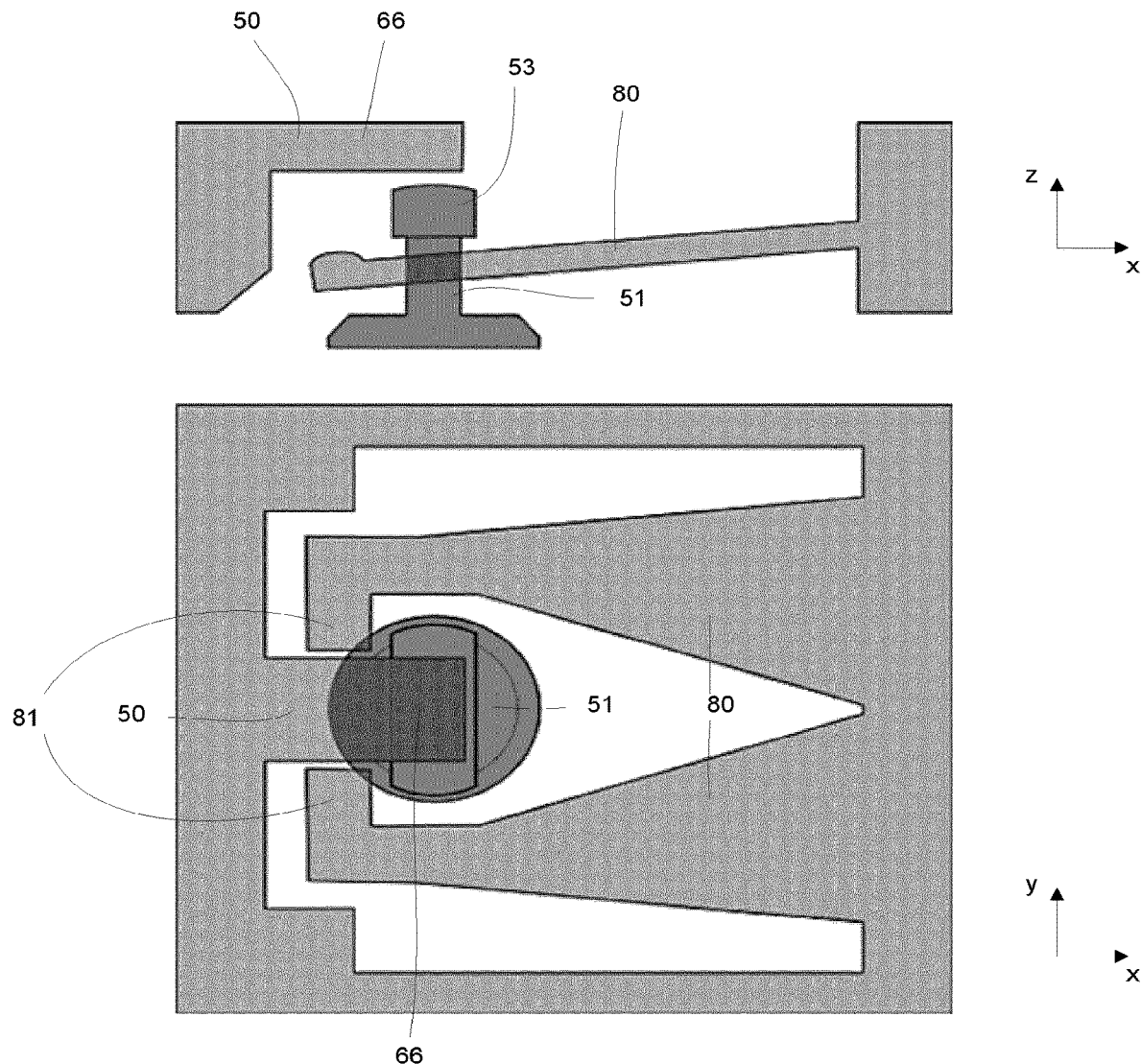
FIGS. 16 and 17 schematically depict operation of an engagement mechanism by the pellicle frame attachment apparatus.
Figure 17:
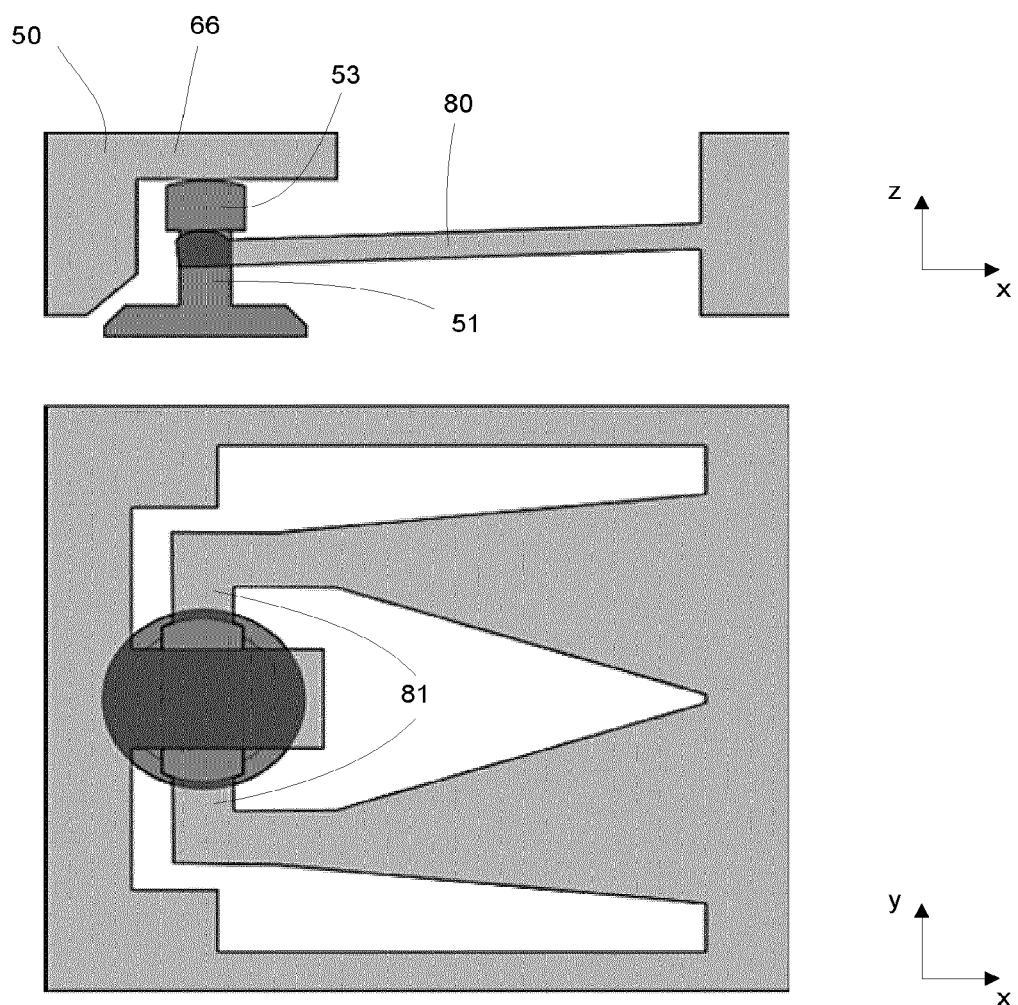

FIGS. 16 and 17 schematically depict the manner in which the engagement mechanism 50 is brought into engagement with the protrusion 51 (which may also be referred to as a stud). Both Figures show the engagement mechanism and protrusion in cross-section viewed from one side and also viewed from below. Referring first to FIG. 16, the engagement arms 80 are pushed away from the cap 66 using manipulator pins (not depicted) which push against distal ends of the engagement arms. As may be seen from FIG. 16, there is no contact between the engagement mechanism 50 and the protrusion 51 at this point.

The engagement mechanism is moved in the x-direction until the distal head 53 of the protrusion 51 is located above the engagement tabs 81 which project from the engagement arms 80. This movement is achieved by moving the pellicle frame to which the engagement mechanism 50 is fixed and thus moves all engagement mechanisms in unison.

Once the engagement mechanism 50 is in position the manipulator pins which were pushing the engagement arms 80 away from the distal head 53 of the protrusion 51 are removed. Since the engagement arms 80 are resilient they move downwards and push against an inner surface of the distal head 53. The engagement tabs 81 thus press the distal head 53 against the cap 66, thereby securing the engagement mechanism 50 to the protrusion 51. This is depicted in FIG. 17.

It may be desired to remove the pellicle assembly 16 from the patterning device MA (e.g. if contamination has been detected on the pellicle). This removal may be performed by the pellicle frame attachment apparatus 857. The above sequence is reversed in order to disconnect the engagement mechanism 50 from the protrusion 51.

Operation of the pins 1090, hooked members 1091 and manipulator pins 1092 may be manual, automated, or semi-automated.

The pins 1090, hooked members 1091 and manipulator pins 1092 may for example be formed from steel. Surfaces of the pins 1090, hooked members 1091 and manipulator pins 1092 which contact the engagement mechanism 50 may be provided with a coating of material such as polyether ether ketone (PEEK) or some other robust material. Alternatively, the contact surfaces may simply be polished surfaces of the pins 1090, hooked members 1091 and manipulator pins 1092.

Once the pellicle assembly 16 and patterning device MA have been connected together to form a mask assembly 15, the mask assembly may be placed in a mask assembly transport device 853 for transportation to a lithographic apparatus LA (see FIG. 2).

Figure 18A:
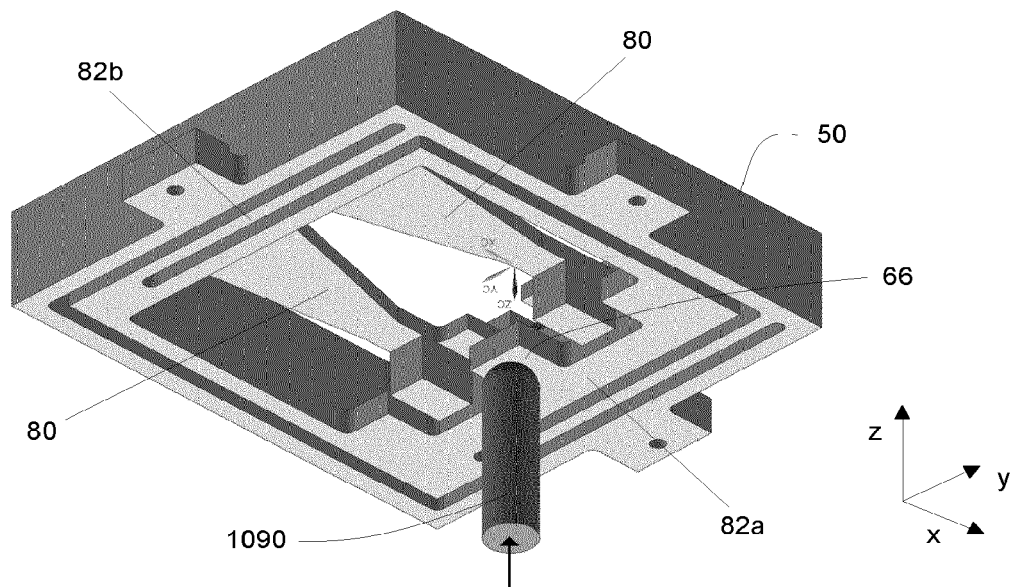
FIGS. 18A-18H depict in more detail operation of the engagement mechanism by the pellicle frame attachment apparatus.

FIGS. 18A-H depict in more detail one manner in which the engagement mechanism 50 may be engaged with the protrusion 51. Referring first to FIG. 18A, a pin 1090 is moved in the z-direction until it touches the cap 66 of the engagement mechanism 50. The pin 1090 is moved further in the z-direction to lift up the engagement mechanism 50. Since the engagement mechanism is secured to the frame 17 (see FIG. 3) this lifts the entire pellicle assembly 16. The pin 1090 is one of four pins (see FIGS. 12 and 13) and the pins are moved in unison. The pellicle assembly 16 is thus lifted by the four pins 1090 and is supported by those pins. The position of the pellicle assembly 16 is then adjusted using the actuators 111 (see FIG. 12) until the pellicle assembly is aligned relative to the patterning device MA.

Figure 18B:
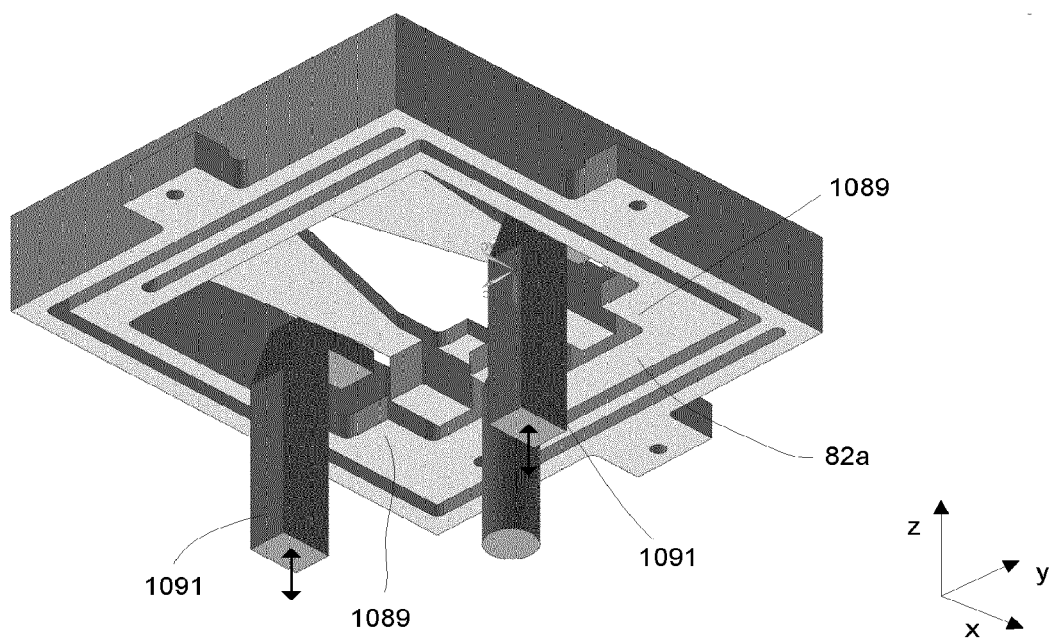

Referring to FIG. 18B, two hooked members are then moved in the z-direction until their distal ends are beyond an uppermost surface of the first support arm 82a. The hooked members 1091 are then moved in the x-direction until distal ends of the hooked members are above corner plates 1089 of the support arm 82a.

Figure 18C:
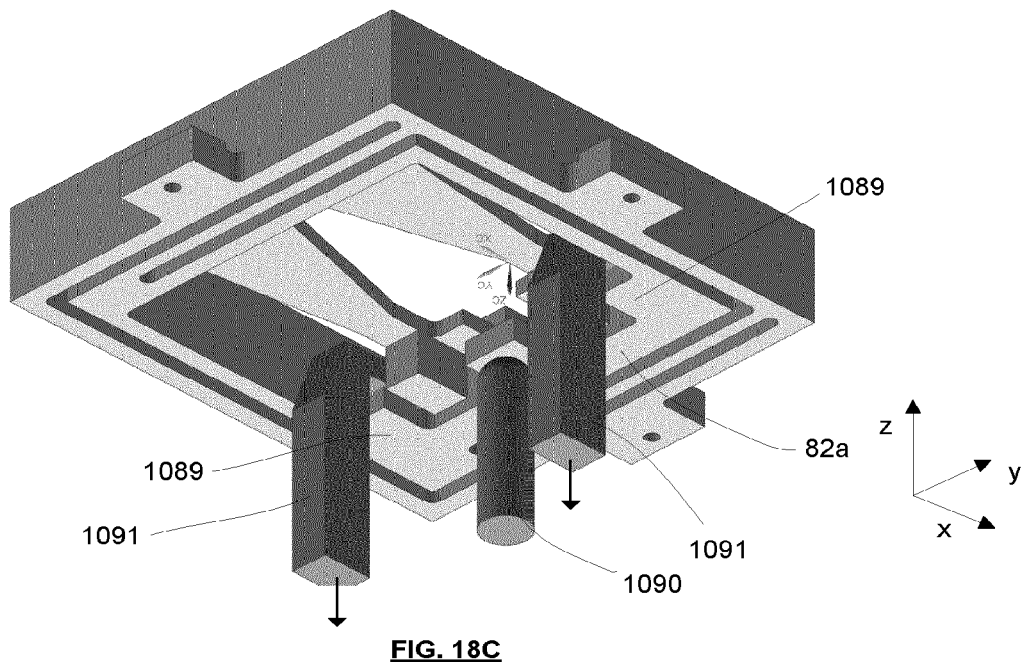

As depicted in FIG. 18C, the hooked members 1091 are then moved downwards until they come into contact with the corner plates 1089 of the support arm 82a. The pin 1090 and hooked members 1091 together grip the engagement mechanism 50 to allow subsequent operation of the engagement mechanism.

Figure 18D:
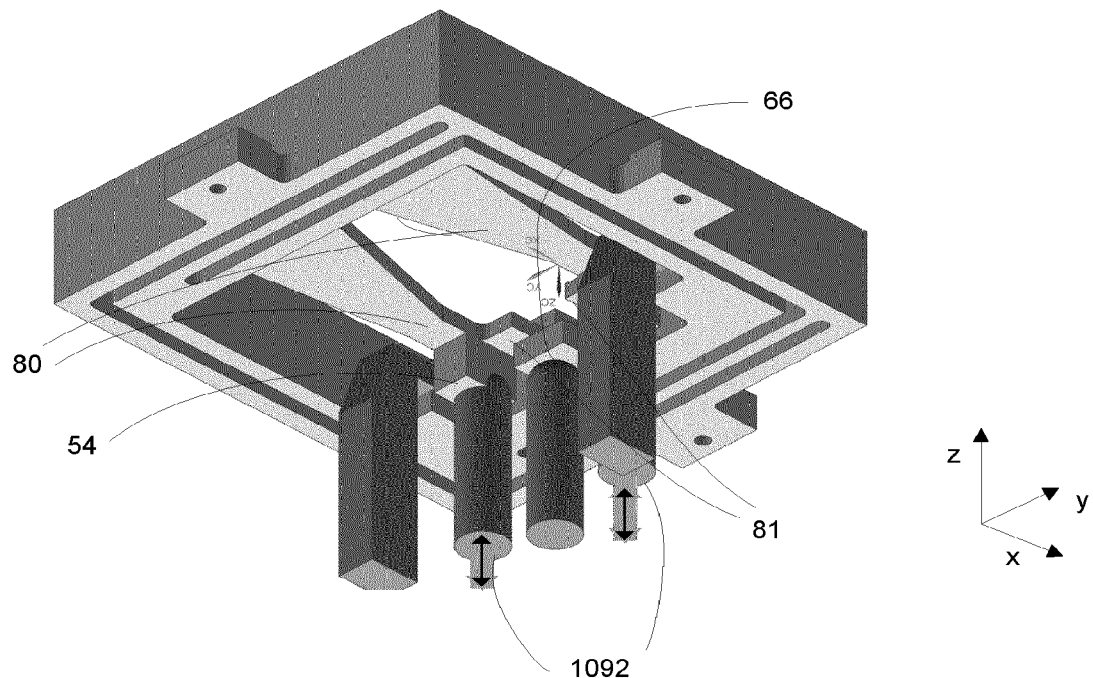

Referring to FIG. 18D, manipulator pins 1092 are moved in a generally vertical direction and push against blocks 54 provided at distal ends of the engagement arms 80. The manipulator pins 1092 push the engagement arms 80 upwards thereby enlarging a space between the engagement tabs 81 and the cap 66. The engagement arms 80 are not bent upwards in FIG. 18D due to the limitations of the software used to generate the Figures.

Figure 18E:
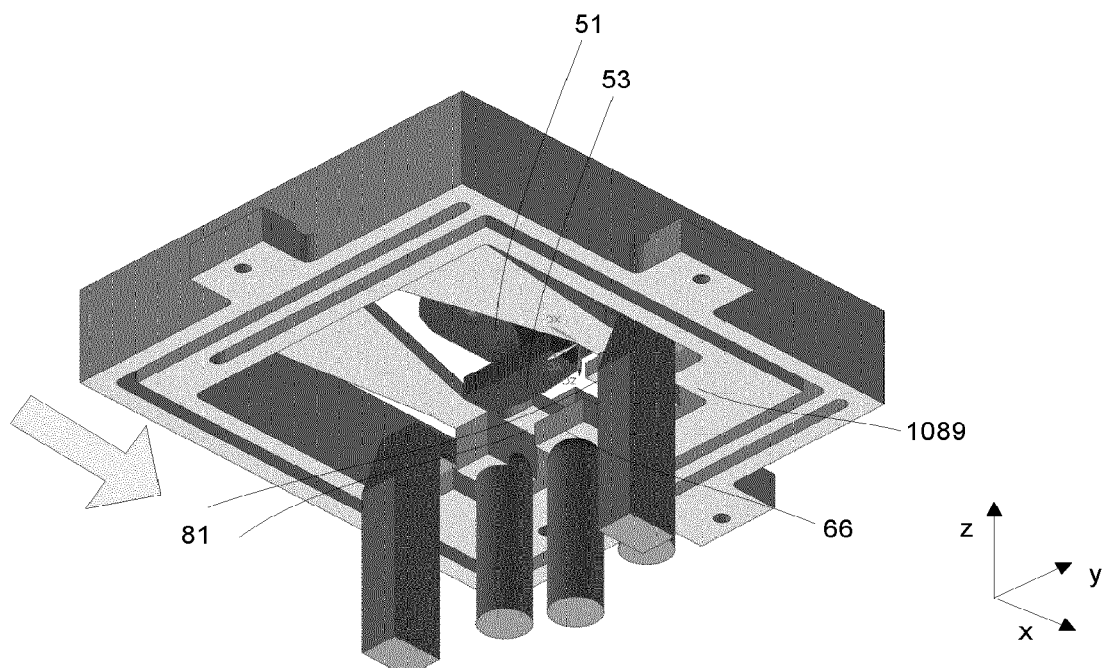
Figure 18F:
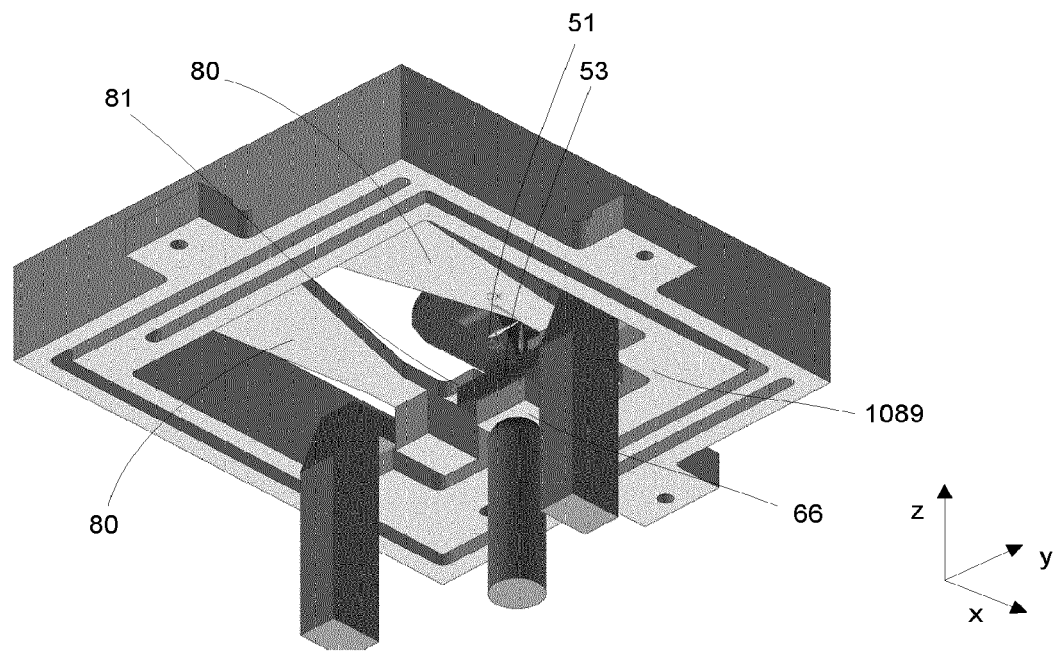

Referring to FIGS. 18E and 18F, the engagement mechanism 50 is then moved in the x-direction until the distal end 53 of the protrusion 51 is located above the cap 66 and is located beneath the engagement tabs 81.

As noted further above, all engagement mechanisms 50A-D are moved in unison via movement of the pins 1090 (see FIG. 3). In an alternative arrangement the patterning device and protrusions 51 may all be moved instead of moving the pellicle frame. In general, lateral relative movement between the protrusions and the engagement mechanisms is all that is required. The direction of lateral movement will depend upon the orientation of the engagement arms 80 (and may for example be the y-direction rather than the x-direction).

Referring to FIG. 18F, once the cap 66 is positioned under the distal head 53 and the engagement tabs 81 are above the distal head 53, the manipulator pins 1092 are retracted. The resilience of the engagement arms 80 is such that they return towards their original positions and thus press the engagement tabs 81 against the distal head 53. The engagement tabs 81 push the distal head 53 against the cap 66. This secures the engagement mechanism 50 to the protrusion 51.

Figure 18G:
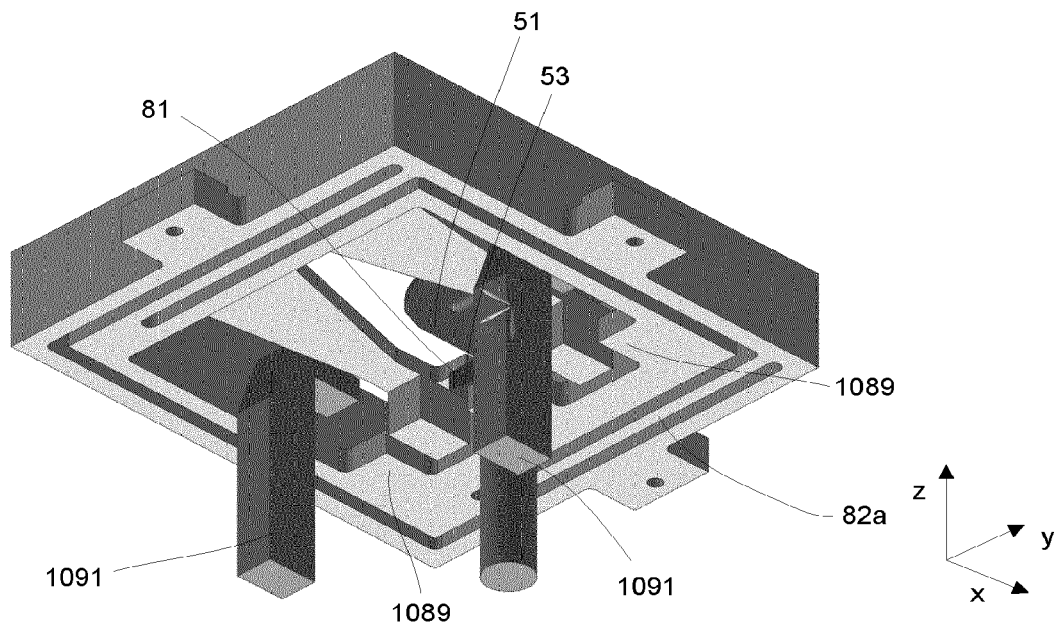

Referring to FIG. 18G, the hooked members 1091 are moved upwards and then moved in the x-direction until they are located away from the corner plates 1089 of the support arm 82a. The hooked members 1091 are then retracted.

Figure 18H:
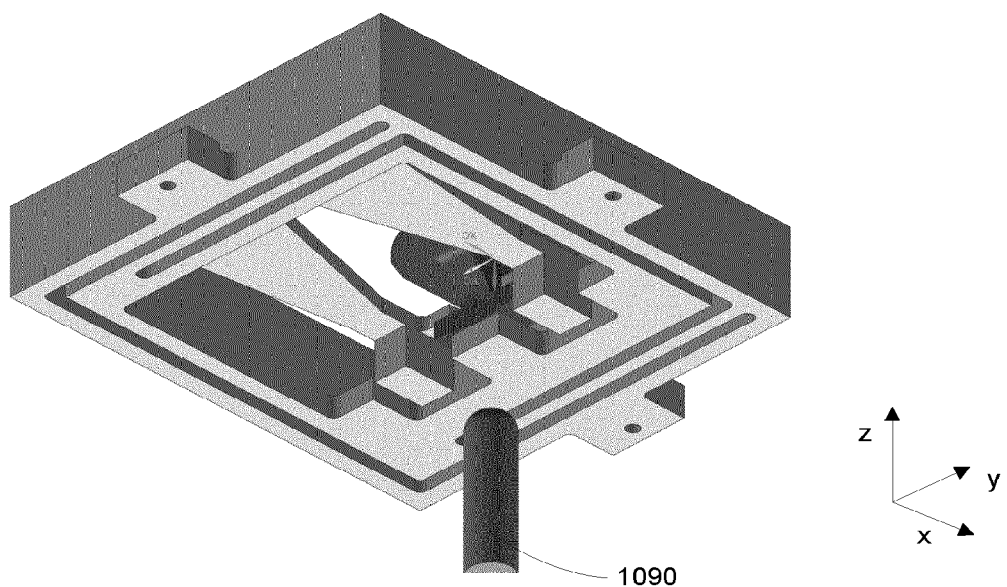

Referring to FIG. 18H, in a final step the pin 1090 is retracted. Referring to FIG. 12, when the pins 1090 are retracted the pellicle frame 17 is no longer supported by the pins but instead is supported by its connection to the protrusions 51 which project from the patterning device MA. In other words, the pellicle frame 17 is attached to and supported by the patterning device MA.

The engagement mechanism 50 is secured to the protrusion 51 and thus provides a secure sub-mount 10 for the pellicle frame (see FIG. 3). The pellicle frame is thus securely attached to the patterning device. The pellicle, pellicle frame and patterning device (which may together be referred to as a mask assembly) may then be placed in a transport device 853 for transportation to a lithographic apparatus LA (see FIG. 2).

The steps depicted in FIGS. 18A-H are reversed in order to detach the engagement mechanism 50 from the protrusion 51 and thereby detach the pellicle frame from the patterning device.

None of the steps via which the engagement mechanism 50 is secured to the protrusion 51 require any sliding movement between components. In other words, no rubbing of surfaces against each other in a sliding motion is required. This is advantageous because such rubbing may be liable to cause unwanted particulate contamination.

An alternative sequence of steps (not depicted) may be used to attach the engagement mechanism 50 to the protrusion 51. In this alternative sequence the hooked members 1091 are moved into position above the engagement tabs 1089 before the pins are used to raise the pellicle frame.

Once the hooked members 1091 are in position the pin 1090 is then moved upwards to press against the engagement mechanism. The engagement mechanism is thus gripped by the hooked members 1091 and the pin 1090. The engagement mechanism 50 is then lifted by moving the hooked members 1091 and the pin 1090 upwards. The same actions are performed for other engagement mechanisms, and thus the pellicle assembly is lifted. The pellicle assembly is then aligned relative to the patterning device using the actuators 101 and imaging sensors 105, 106 (see FIG. 12). The remaining steps may be as described above with reference to FIGS. 18A-H.

Embodiments of stud attachment and stud removal apparatuses are now described in connection with FIGS. 19-27.

Figure 19:
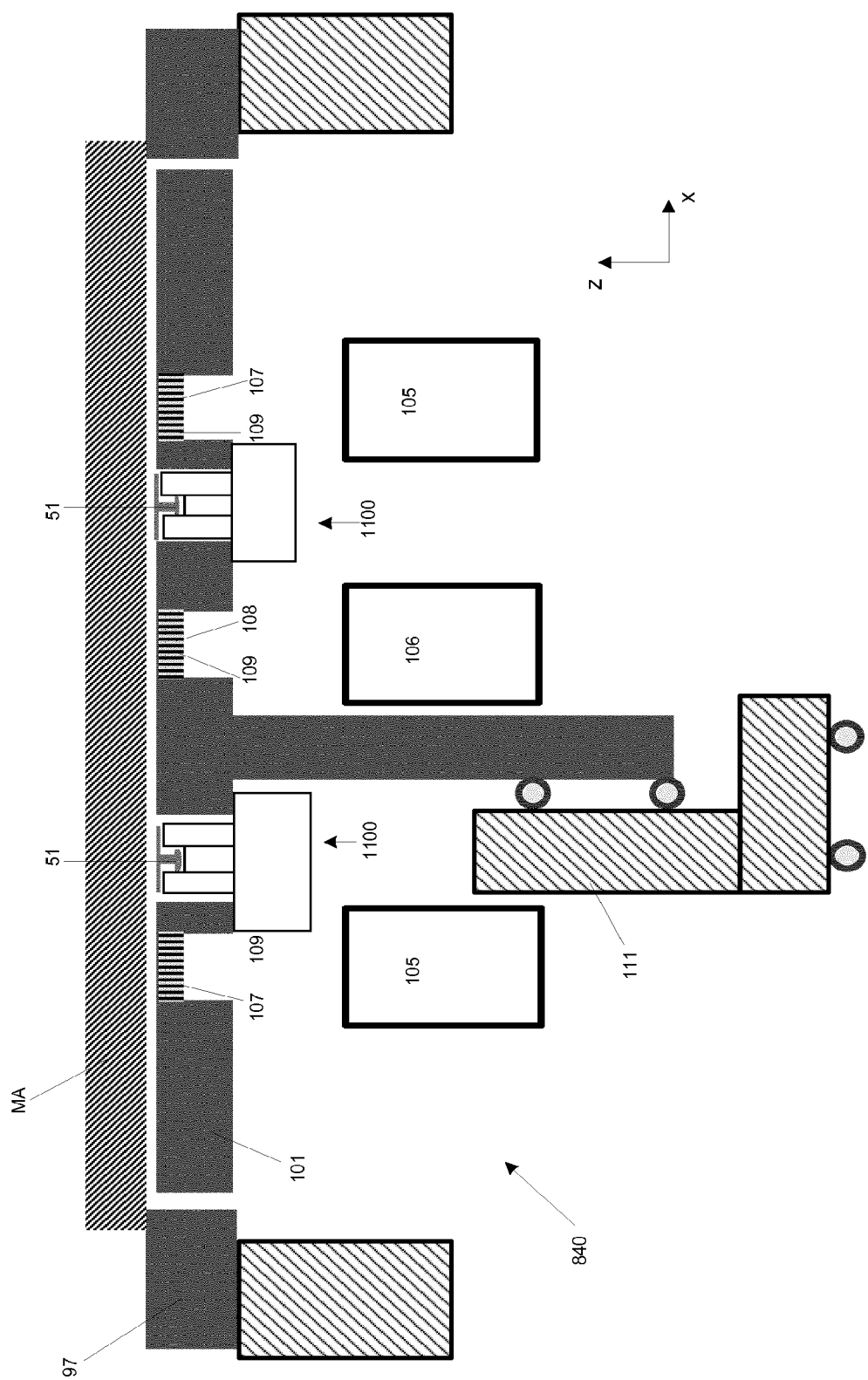
FIG. 19 schematically depicts a stud attachment apparatus according to an embodiment of the invention.

FIG. 19 schematically depicts in cross-section a stud attachment apparatus 840 according to an embodiment of the invention. The stud attachment apparatus 840 has similarities with the pellicle attachment apparatus 855 depicted in FIG. 6 and the pellicle frame attachment 857 apparatus depicted in FIG. 12. Parts of the stud attachment apparatus 840 may correspond with parts of those other apparatuses.

The stud attachment apparatus 840 comprises a support structure 101 and stud manipulators 1100 configured to move protrusions 51 (which may also be referred to as studs) vertically such that they come into contact with the patterning device. Windows 107, 108 are provided in the support structure 101 and imaging sensors 105, 106 (e.g. cameras) are positioned to look through the windows towards the patterning device MA. Alignment marks 109 are provided on the windows and may be used to align the support structure 101 relative to the patterning device MA. Actuators 111 are provided to move the support structure 101, and thus to move studs 51 which are held by the support structure 101. The actuators 111 are capable of moving the support structure in the x, y and z directions and are also capable of rotating the support structure about the z direction. The actuators 111 may be automated, manual or semi-automated (i.e. partially automated and partially manual). The stud attachment apparatus 840 further comprises an additional support structure 97 which is configured to support the patterning device MA. This additional support structure may be fixed, and is referred to herein as the fixed support structure 97.

In use, glue is provided on the base of each stud 51 whilst the studs are being held by the support structure. The patterning device MA is then placed onto the fixed support structure 97, such that the patterning device MA is positioned a few millimeters above the support structure 101. The actuators 111 are used to move the support structure 101 until alignment marks 109 provided in the windows 107, 108 are aligned with alignment marks provided on the patterning device MA. The studs 51 are held by the stud manipulators 1100 and have fixed positions in the x and y directions relative to the support structure 101. The separation between the studs 51 (of which there may be four in practice) is a fixed predetermined separation. The separation between the studs 51 corresponds with the separation between the engagement members 50A-D provided on a pellicle frame 17 (see FIG. 3) which will be attached to the patterning device MA.

Once the support structure 101 has been positioned correctly relative to the patterning device MA, the support structure is moved upwards and closer to the patterning device. The stud manipulators 1100 are then used to move the studs 51 upwards from a position in which the bases of the studs do not contact the patterning device MA to a position in which the bases of the studs press against the patterning device. Heaters are then used to heat the studs 51 in order to promote curing of the glue at an interface between the bases of the studs 51 and the patterning device MA.

Figure 20:
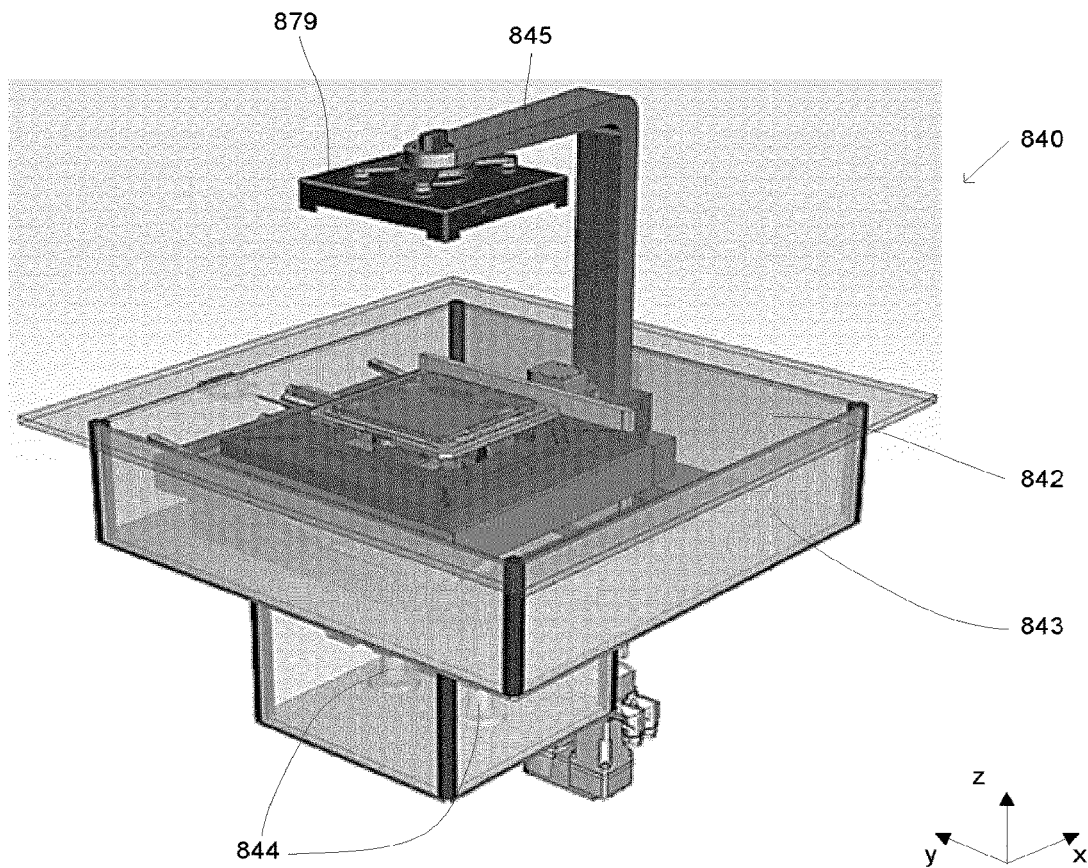
FIG. 20 is a perspective view of the stud attachment apparatus.

FIG. 20 depicts the stud attachment apparatus 840 in a partially transparent perspective view. A partition 842 is depicted which separates the actuators (not visible) from a controlled environment in which the patterning device is provided. The actuators are provided in a box 843 located beneath the partition 842. The imaging sensors 105, 106 which form part of an alignment measurement system 844 for aligning the studs to the patterning device are also provided beneath the partition 842 (as are other parts of the alignment system).

Also depicted in FIG. 20 is a lift unit 845 which may be used to raise and lower a mask support which is used to put the patterning device onto the fixed support 97 (see FIG. 19). The mask support may comprise a housing 879, which will form part of a mask transport device 880 (described further above in connection with FIG. 2). The patterning device (not visible) and housing 879, together with the lift unit 845 may be provided in a controlled environment (walls of which are not depicted). The controlled environment may be held at a pressure which is higher than the pressure on an opposite side of the partition 842, such that contamination is inhibited from flowing through openings in the partition and into the controlled environment. The controlled environment may be provided with a flow of gas from an inlet and may include an outlet through which gas may flow (the flow being sufficiently constrained that the pressure in the controlled environment can be held at a level which is higher than the pressure below the partition 842). This flow of gas may help to remove contaminants from the controlled environment. A filter which collects contaminants may be provided at the gas inlet to prevent or inhibit contaminants from entering the controlled environment.

Points at which the mask comes into contact with the stud attachment apparatus 840 may be provided with a coating of PEEK or some other robust material. Similarly, points at which the mask comes into contact with the housing 879 may be provided with a coating of PEEK or some other robust material.

Figure 21:
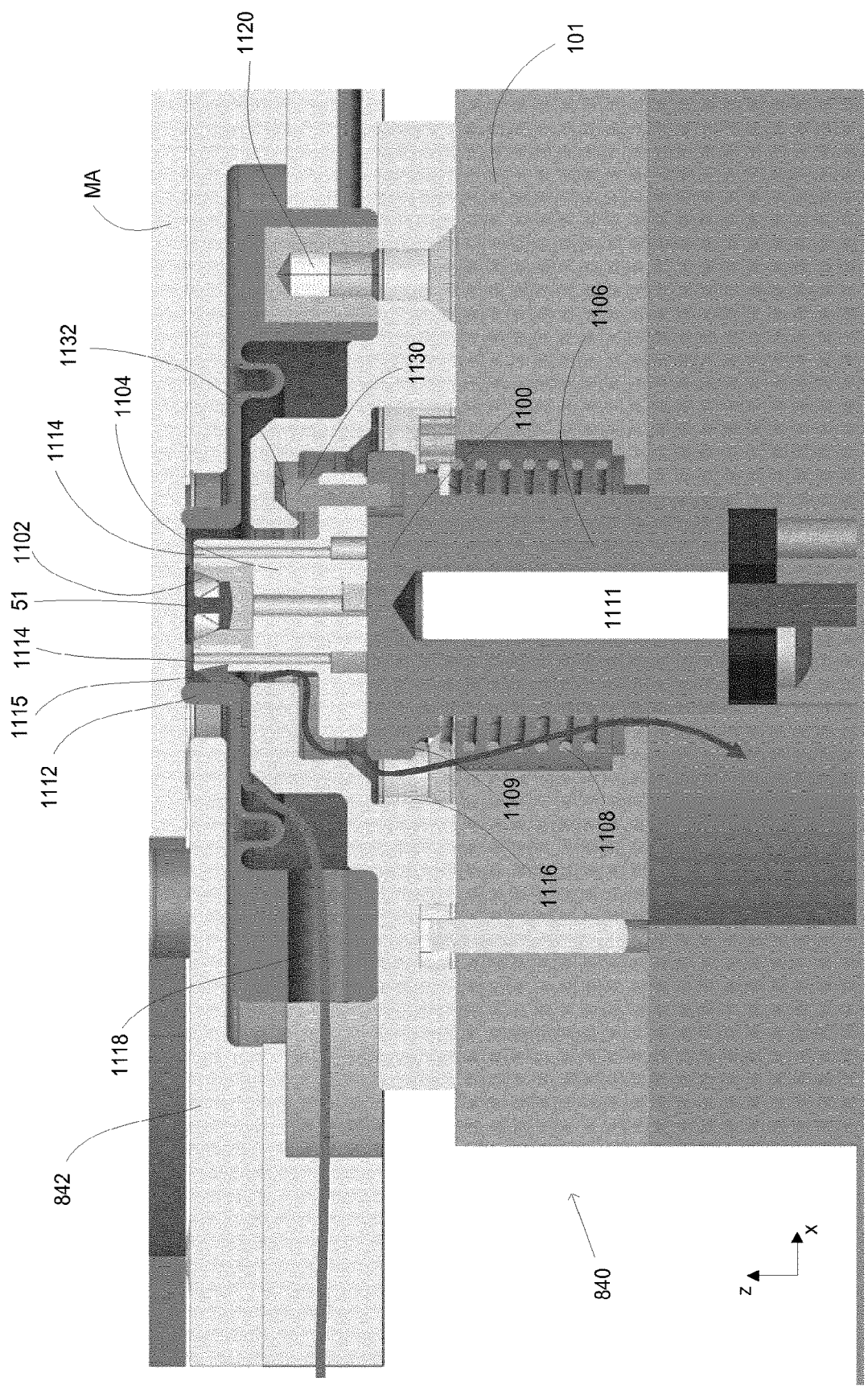
FIG. 21 depicts in cross-section part of the stud attachment apparatus.

Part of the stud attachment apparatus 840 is depicted in more detail in FIG. 21. A stud manipulator 1100 is depicted together with a stud 51 and a patterning device MA (e.g. a mask). Also depicted is a partition 842 which separates an environment in which the patterning device is provided from an environment in which the stud manipulator 1100 is provided. The stud manipulator 1100 comprises a cup 1102 which is dimensioned to receive a stud 51 (which may also be referred to as a protrusion), such that a bottom face of the stud 51 is facing outwards from the cup. The cup 1102 may, for example, be formed from PEEK or some other robust material. The cup 1102 is held in a manipulator head 1104 which in turn is supported on a manipulator body 1106. A spring 1108 is received against a flange 1109 provided on the manipulator body and biases the manipulator head 1104 and the stud 51 upwards. Alignment of the stud 51 relative to the mask is achieved using the imaging sensors 105, 106 and actuators 111 depicted in FIG. 19. When the actuators have aligned the studs 51 to the patterning device MA, the stud manipulator 1100 is moved upwards to press the studs against the patterning device. The stud manipulator 1100 is moved upwards by an actuator (not depicted) which moves all four stud manipulators upwards at the same time. The spring 1108 is compressed when the stud manipulator 1100 presses the stud 51 against the patterning device MA. The spring 1108 partially determines the force with which the stud 51 is pressed against the patterning device MA. A weaker spring will reduce the force with which the stud is pressed against the patterning device, whereas a stronger spring will increase the force which the stud is pressed against the patterning device. Thus, the force with which the stud 51 is pressed against the patterning device MA is selectable (at least in part) via selection of a spring 1108 with a desired strength. The spring 1108 may for example be pre-loaded with a force which pushes the stud manipulator 1100 and stud 51 upwards. The force of the pre-load may for example be less than 5N.

The stud manipulator 1100 pushes the stud 51 against the patterning device MA and thereby allows the stud to be secured to the mask. As noted above, the stud may be provided with glue or adhesive on its base, and the stud manipulator 1100 may press the stud 51 against the patterning device MA until the glue or adhesive has hardened. Once this has taken place, the stud manipulator 1100 may be moved away from the patterning device MA (and/or the patterning device may be moved away from the stud manipulator 1100).

In an embodiment, the stud manipulator 1100 may include a heater 1111 which is configured to heat the stud 51. The heater 1111 may be in the form of an electrical heater (e.g. a resistive electrical heater). When the stud 51 is being held against the patterning device MA the heater 1111 is used to heat the stud. The localized heating of the stud 51 provided by the heater 1111 is advantageous because it accelerates curing of the glue or adhesive. This increases the throughput of the stud attachment apparatus 840. The curing provided by heating the stud 51 may be pre-curing or may be full curing. Where pre-curing is used the patterning device MA and studs 51 may be transferred to an oven for curing. Where heating the stud 51 provides full curing there is no need to transfer the mask and studs to an oven. This is advantageous because the oven may be a source of contamination particles.

In an embodiment, the stud manipulator 1100 may include an actuator (not depicted) which is operative to press the stud 51 against the patterning device MA (in addition to, or instead of, the spring 1108). The actuator may in addition move the cup 1102 away from the stud 51 once the stud has been fixed to the patterning device MA.

A seal 1112 extends around an outer perimeter of the manipulator head 1104. The seal 1112 is most clearly seen in FIG. 22, which depicts part of the stud manipulator 1100 as viewed from above (looking through the patterning device MA which is generally transparent in FIG. 22 for ease of illustration). As may be seen from FIG. 22, in the illustrated embodiment the seal 1112 is annular in shape. However, the seal may have any suitable shape.

Referring again to FIG. 21, the seal 1112 is formed from resilient material (e.g. PEEK) and projects above the partition 842 and above the stud 51. Thus, when the stud is pressed against the patterning device MA the seal 1112 is pushed downwards. The resilient nature of the seal 1112 means that the seal presses against the patterning device MA and thereby forms a seal against the patterning device. This seals the portion of the patterning device MA within the perimeter of the seal 1112 and isolates it from the portion of the patterning device MA which is outside of the perimeter of the seal.

Figure 22:
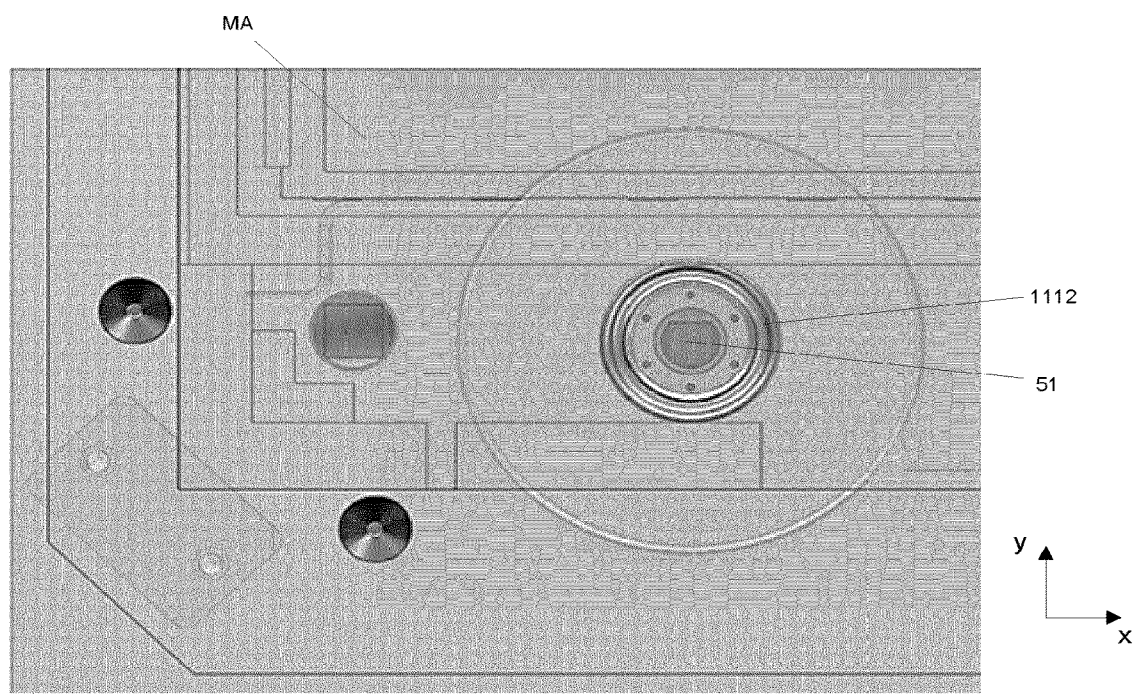
FIG. 22 depicts part of the stud attachment apparatus viewed from above.

Gas extraction channels 1114 are provided in the manipulator head 1104, the gas extraction channels extending away from outer face of the manipulator head. An additional gas extraction route is provided by an annular space 1115 around the manipulator head 1104. A gas delivery channel 1118 is provided on one side of the seal 1112 and allows gas to be delivered to the area of the patterning device MA which is located within the seal. This is schematically depicted by arrows in FIG. 21. The gas is extracted via the gas extraction channels 1114 in the manipulator head and the annular space 1115 around the manipulator head. The gas extraction channels 1114 are distributed around the manipulator head 1104, as is best seen in FIG. 22. A flow of gas is provided which will transport contaminants out of the gas extraction channels 1114 and the annular space 1115 and thereby prevent those contaminants adhering to the surface of the patterning device MA. The contamination may for example be particulates derived from the glue provided on the stud 51 or chemical vapour from the glue. Chemical vapour may in particular be generated when the glue is heated for curing. Removing contamination using the gas glow is advantageous because, as is explained elsewhere, particulates or other contamination on the surface of the patterning device MA may cause errors in a pattern projected on to a substrate by a lithographic apparatus. The gas may, for example, be air.

In an embodiment the seal 1112 may be a complete seal, i.e. no gas flows past the seal. In an alternative embodiment, the seal 1112 may form an incomplete seal against the patterning device MA, such that some gas can flow between the seal and the mask. This may be referred to as a leakage seal (i.e. the seal 1112 is a leakage seal). The seal 1112 may for example not make contact with the patterning device, such that there is a gap between the seal and the patterning device. The pressure of the gas within the seal may be lower than the pressure of gas outside of the seal, and as a result gas will flow from outside the seal to inside the seal and then out through the gas extraction channels 1114 and the annular space 1115. This is advantageous because contamination particles will be transported by the flow of gas from an area of the patterning device MA which is outside of the seal 1112, pass through the seal, and flow out of the extraction channels 1114. A further advantage of the leakage seal configuration is that avoiding contact between the seal 1112 and the patterning device MA prevents contamination being transferred from the seal to the patterning device.

Figure 23:
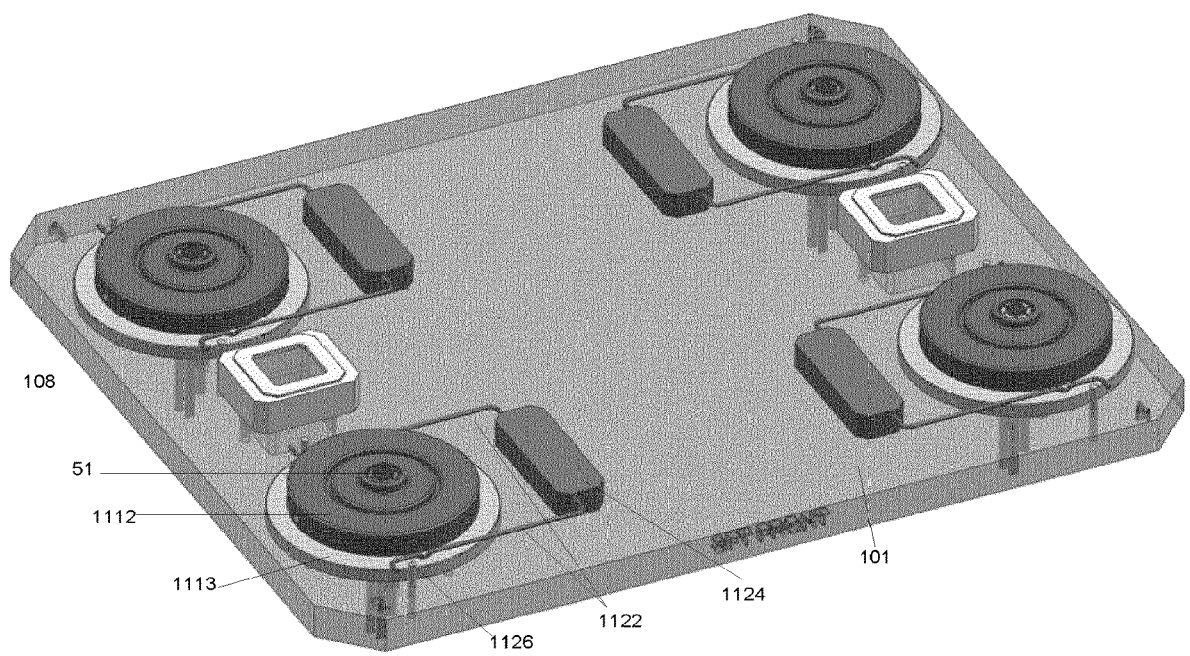
FIG. 23 depicts the stud attachment apparatus viewed from above but with a partition having been removed.

FIG. 23 is a perspective view of four studs 51 provided on the support structure 101, each stud being surrounded by a seal 1112. Each seal 1112 is held on a seal support plate 1113 which is secured to the support structure 101. Also shown in FIG. 23 are two windows 108 through which imaging sensors 106 (see FIG. 19) may view the patterning device MA (not depicted).

Figure 24:
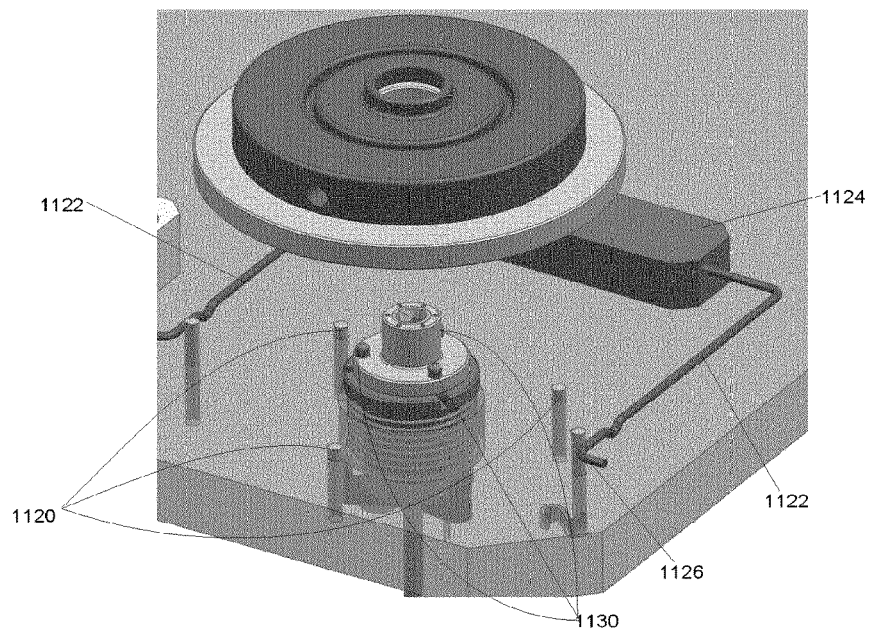
FIG. 24 depicts part of the stud attachment apparatus in a partially disassembled state.

Each seal support plate 1113 is removable along with an associated seal 1112 from the support structure 101 (e.g. to allow replacement of a worn seal). FIG. 24 depicts one seal support plate 1113 and seal 1112 removed from the support structure 101. As may be seen, positioning pins 1120 extend upwards from the support structure 101. These positioning pins 1120 are received in holes (one of which is visible in FIG. 21) in the seal support plate 1113, and thereby ensure that the seal support plate is correctly positioned on the support structure 101.

Retaining arms 1122 extend from a block 1124. The retaining arms 1122 are located over the seal support plate 1113 and press against pins 1126 which extend upwards from the support structure 101. The retaining arms 1122 are resiliently biased against the pins 1126 and press against the pins 1126, thereby securely holding the seal support plate 1113 in place on the support structure. The resilient retaining arms 1122 can be manually disengaged from the pins 1126 by moving opposing arms towards each other, thereby allowing the seal support plate 1113 (and seal 1112) to be removed.

Only the studs 51 (and the seal 1112 if a leakage seal is not used) come into contact with the patterning device. The stud manipulator 1100 is flexibly connected to the support structure 101 to allow the stud manipulator to move relative to the support structure when the stud 51 is being pressed onto the patterning device MA. This flexible connection is provided via the spring 1108. As a result, when the stud 51 is pressed against the patterning device MA, the stud manipulator 1100 may move relative to the support structure 101. This is advantageous because it avoids significant lateral forces being applied at the interface between the stud 51 and the patterning device MA, thereby avoiding for example sliding movement of the stud over the surface of the patterning device (such movement would generate contamination and is undesirable).

A kinematic connection is provided between the stud manipulator 1100 and the support structure 101. The kinematic connection is such that the stud manipulator 1100 can press against the support structure when the stud 51 is not in contact with the patterning device, but allows the stud manipulator to disconnect easily from the support structure 101 when the stud 51 contacts the patterning device. Referring again to FIG. 24, three protrusions 1130 with rounded heads project from the stud manipulator 1100 and are distributed around the stud manipulator. One of the three protrusions 1130 is visible in FIG. 21. The protrusions 1130 engage with an angled inner surface 1132 of the seal support plate 1113. The angled inner surface 1132 is generally flat, whereas, as mentioned above, the protrusion 1130 has a rounded upper surface. This combination of surfaces is advantageous because it provides a very small contact area between the protrusion 1130 and the angled inner surface 1132. The other two protrusions contact angled inner surfaces of the seal support plate in the same manner.

In use, when the stud 51 is not in contact with the patterning device MA the spring 1108 presses the protrusions 1130 against the angled inner surface 1132 of the seal support plate 1113. This provides a connection between the stud manipulator 1100 and the support structure 101. The connection may be a kinematic connection. When the stud 51 is pressed against the patterning device MA the spring 1108 is compressed thereby moving the protrusions 1130 away from the angled inner surfaces 1132 of the seal support structure 101. The three protrusions 1130 might not all separate from the angled inner surfaces 1132 at exactly the same time, for example if there is a relative tilt between the patterning device MA and the support structure 101. Instead, one will separate followed by a second and then by a third. The kinematic connection allows this serial separation to take place and allows the stud 51 to remain substantially perpendicular to the patterning device MA. In other words, the kinematic connection avoids forcing the stud 51 to have an orientation which is determined by the support structure 101 and instead allows the stud to have an orientation which is determined by the patterning device MA.

It may be desired to remove the studs 51 from the patterning device MA. This removal may be performed using a stud removal apparatus. The stud removal apparatus may have a form which generally corresponds with the stud attachment apparatus 840 (e.g. as schematically depicted in FIG. 19). For example, the stud removal apparatus may include a partition which separates a controlled environment in which the patterning device MA is held during stud removal from stud removers and other components. The controlled environment may have a higher pressure than other parts of the apparatus. The stud removal tool may for example comprise stud removers in a configuration which corresponds with that shown in FIG. 19. Since relatively coarse alignment of the stud removers to the studs 51 is sufficient to allow removal to be achieved, in an embodiment the imaging sensors 105, 106 and windows 107, 108 may be absent from the stud removal apparatus. Alignment of the heaters and actuators to the studs may be performed using a manual, semi-automated or automated system.

Figure 25:
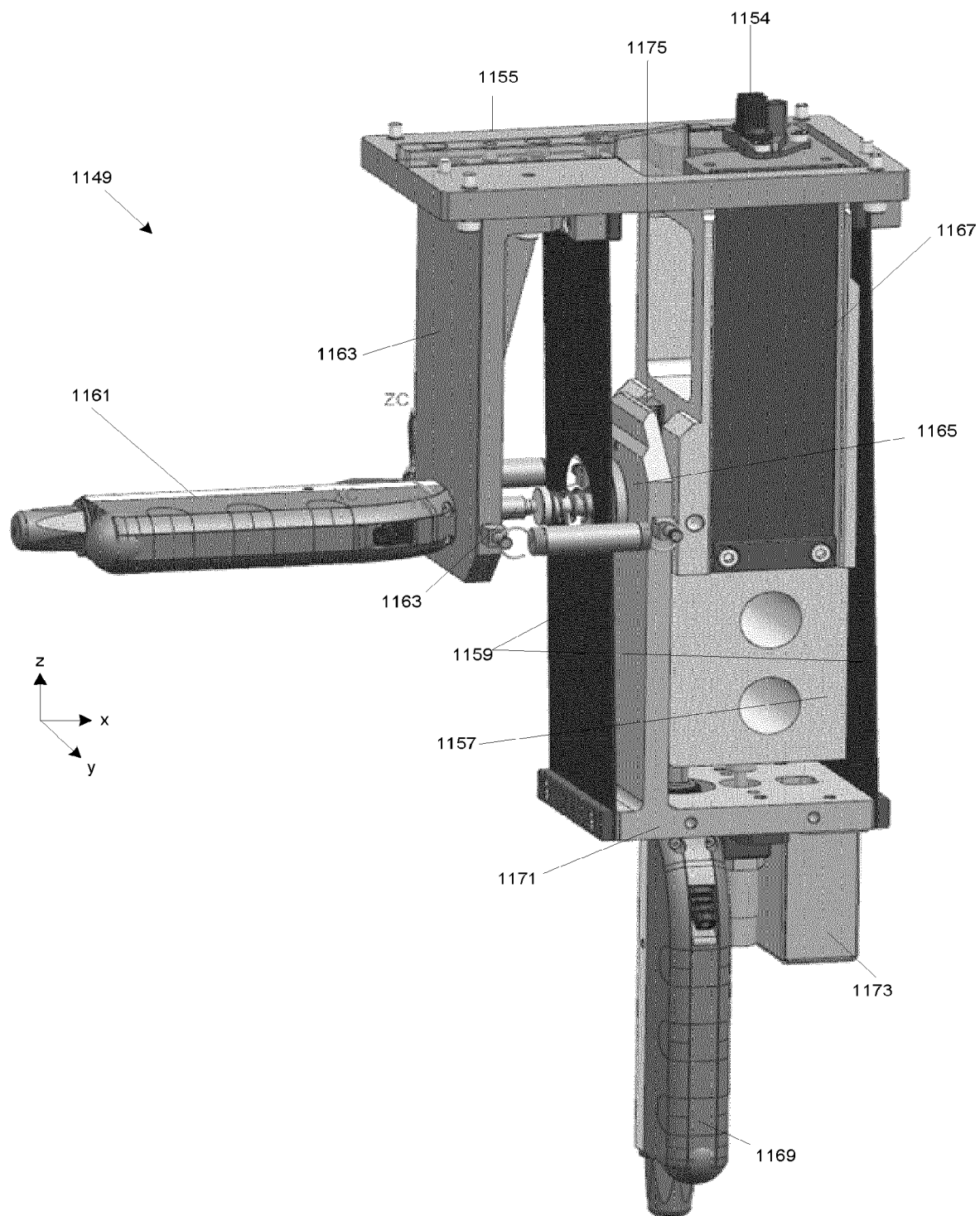
FIG. 25 is a perspective view of a stud remover which forms part of a stud removal apparatus according to an embodiment of the invention.

FIG. 25 is a perspective view of a stud remover 1149 which forms part of a stud removal apparatus according to an embodiment of the invention. The stud remover 1149 comprises a stud gripper 1154 connected to a support plate 1155. A weight 1157 extends downwardly from the stud gripper 1154. A pair of leaf springs 1159 extend downwardly from the support plate 1155 and are configured to allow movement of the stud gripper 1154 in the x-direction (the leaf springs allow movement in a generally vertical direction).

An actuator 1161 is connected to a flange 1163 which projects downwards from the support plate 1155. The actuator includes an arm 1164 which passes through an opening in one of the leaf springs 1159 and connects against a hooked member 1165 that is in contact with the weight 1157. A ridge and groove connection 1175 between the hooked member 1165 and the weight 1157 is provided which allows the weight to move vertically relative to the hooked member but prevents relative movement of the hooked member and the weight in the x and y directions. Thus, moving the arm 1163 in the x-direction using the actuator 1161 will cause the hooked member 1165 and the weight 1157 to move in the x-direction.

A second pair of leaf springs 1167 (only one of which is visible in FIG. 25) allows movement of the stud gripper 1154 in the y-direction. No y-direction actuator is provided. Instead, some passive movement in the y-direction may occur as the stud moves into the stud gripper 1154 (as explained below).

An actuator 1169 is located beneath the hooked member 1165 which is connected via the ridge and groove connection 1175 to the weight 1157 (the weight in turn being connected to the stud gripper 1154. The actuator 1169 is operable to move the stud gripper 1154 in the vertical direction (in this case denoted as the z-direction).

Thus, movement of the stud gripper 1154 in the x, y and z directions is provided for by the stud remover 1149.

The weight 1157 may for example be at least 1 kg. The weight may for example be around 3 kg.

A receptacle 1173 is provided adjacent to the z-direction actuator 1169 and is configured to receive studs which have been removed from patterning devices.

Figure 26:
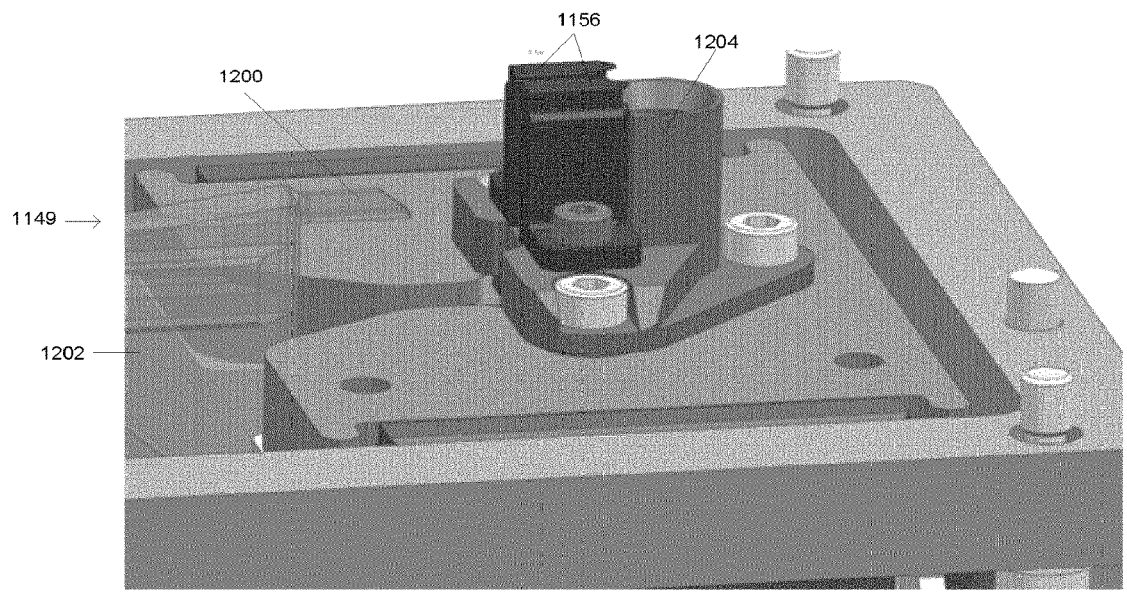
FIG. 26 is a perspective view of part of the stud remover in more detail.
Figure 27:
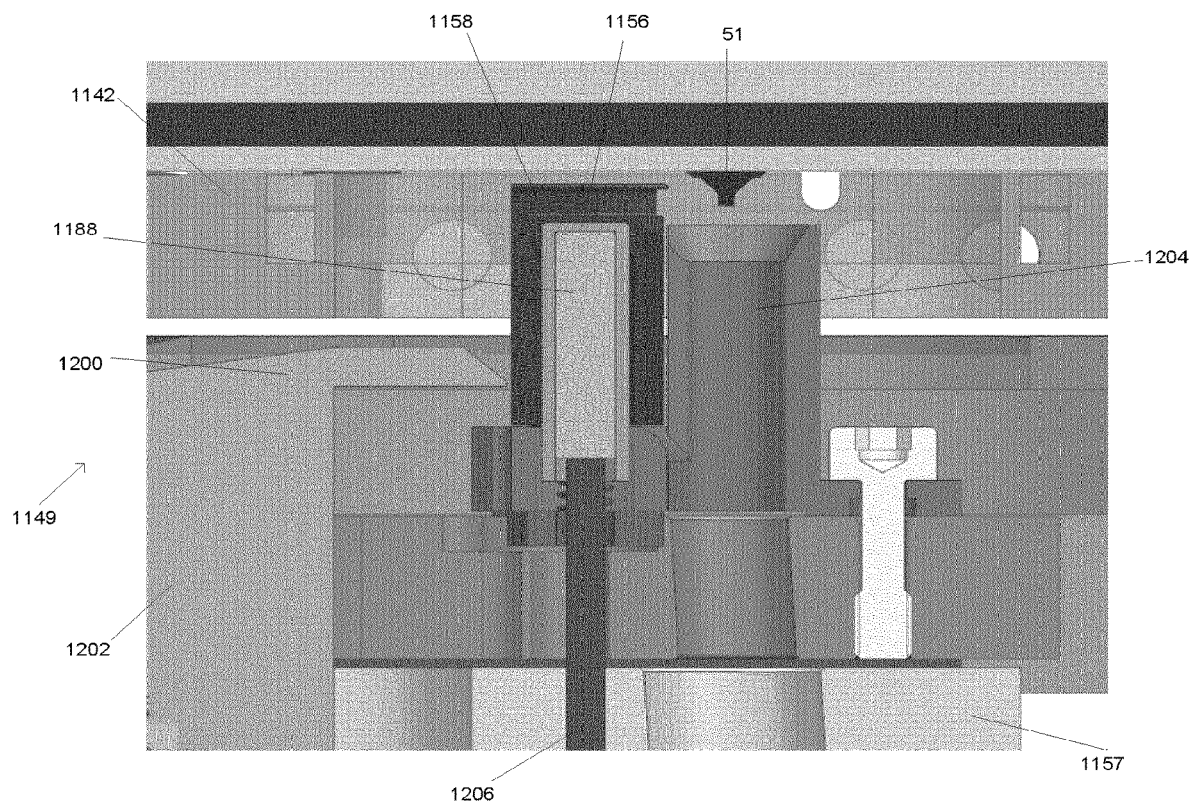
FIGS. 27 to 29 are cross-sectional views of part of the stud remover.

FIGS. 26 and 27 depict in perspective view and in cross-section part of the stud remover 1149 in more detail. FIG. 27 also includes a stud 51 and a patterning device MA (e.g. mask). The stud gripper 1154 comprises a pair of opposed flanges 1156 which extend towards each other to establish a gap which is wider than a neck of the stud 51 but narrower than a distal head 853 of the stud. Below the opposed flanges 1156, recesses 1158 are provided which are wider than the distal head of the stud 51 and can thus receive the distal head of the stud. The distal head of the stud 51 is not clearly visible in FIGS. 26 and 27 because the head extends into and out of the plane of the figures. The recesses 1158 and opposed flanges 1156 flare outwardly at one end of the stud gripper 1154.

The stud remover 1149 includes a heater 1188 which is located beneath the stud gripper 1154. The heater is an electrical heater, e.g. a resistive heater, and is configured to locally apply heat to the stud gripper 1154. The stud remover further comprises a pusher arm 1200 which is connected to an actuator 1202. The pusher arm 1200 is configured to push the stud 51, once removed from the patterning device MA, into a chute 1204. The chute 1204 leads to the receptacle 1173 (see FIG. 25).

A wire 1206 extends downwards from the heater 1188 and is connected to the weight 1157 (see FIG. 25).

Figure 28:
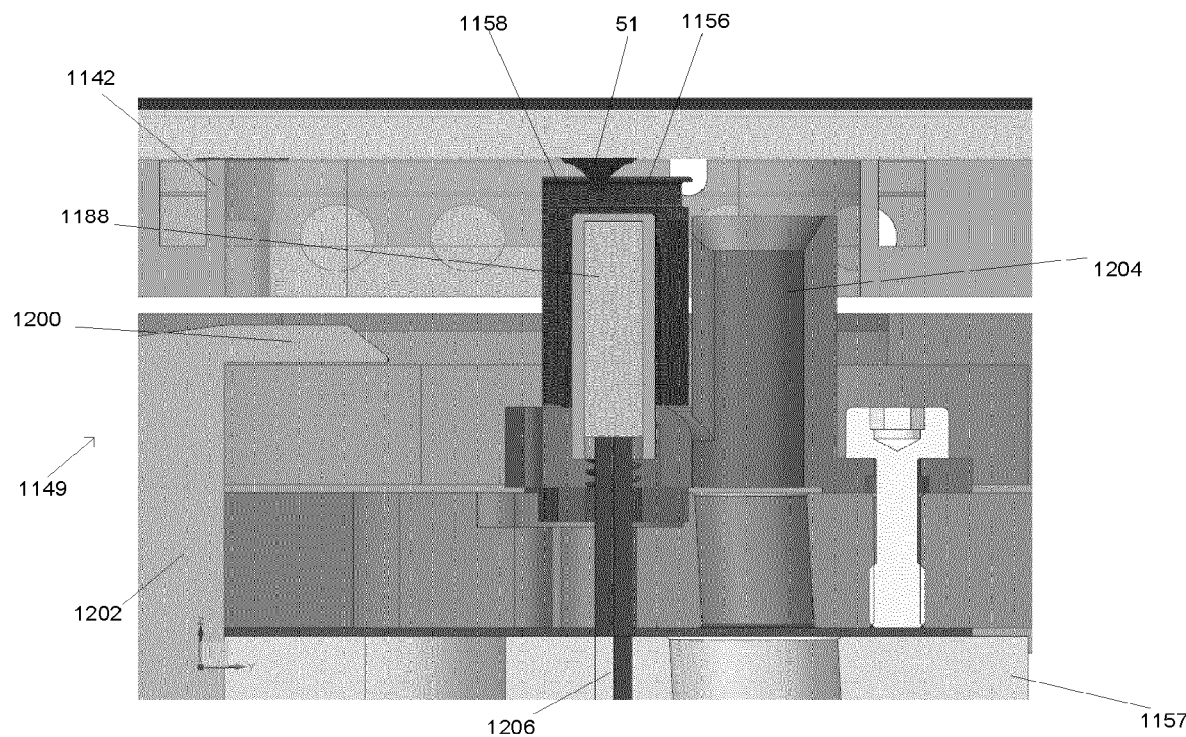

In use, the actuator stud gripper 1154 is initially in a position which is to the left of the stud and does not project above a partition 1142 of the apparatus. The stud gripper 1154 is then moved upwards using the vertical actuator 1169 (see FIG. 25) to the position shown in FIG. 27. The stud gripper is thus adjacent to but not touching the patterning device MA. The x-direction actuator 1161 (see FIG. 25) then moves the stud gripper 1154 in the x-direction such that the distal head 853 of the stud 51 enters the stud gripper via the flared ends thereof and is then located in the non-flared portion (as depicted in FIG. 28). This may involve some passive movement of the stud griper 1154 in the y-direction. The vertical actuator 1169 is then moved downwards such that the support plate 1155 no longer supports the stud gripper 1154, the stud gripper instead being pulled downwards by the weight 1157. Heat is delivered to the stud 51 from the heater 1188 via the stud gripper 1154 in order to melt the glue or adhesive which secures the stud to the patterning device MA. Once the glue or adhesive has melted the stud 51 becomes detached from the patterning device MA. The stud 51 moves downwards due to the weight that is pulling it downwards.

Figure 29:
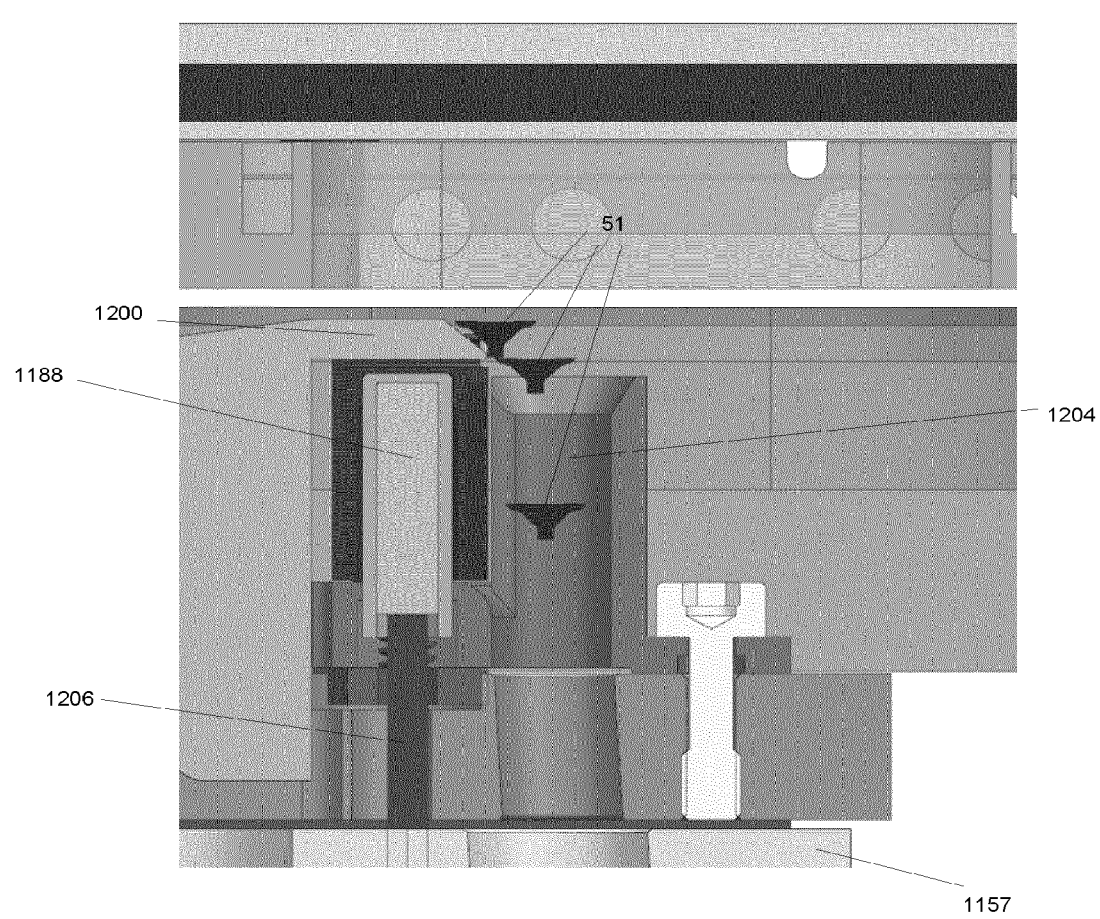

The pusher arm 1200 is then moved in the x-direction as depicted in FIG. 29. The pushes the stud 51 from the stud gripper 1154 into the chute 1204. The stud then falls into the receptacle 1173. The stud 51 is shown in three positions in FIG. 29 in order to illustrate movement of the stud.

The above process is performed for each stud 51 on the patterning device MA. The studs may be removed in series, i.e. one after another. Alternatively, the studs may all be removed together. An advantage of removing the studs in series is that the force being applied to the patterning device is limited to the force needed to remove one stud. This in turn limits the force applied to supports which support the patterning device, thereby minimizing the risk of damage to those supports (and also minimizing the risk of damage to the patterning device).

As noted above, a partition 1142 separates the majority of the stud removal apparatus from a controlled environment in which the patterning device MA is provided. However, no seal extends around an area of the patterning device MA on which the stud 51 is provided. A seal would provide little benefit because the patterning device MA will be cleaned after the stud 51 has been removed, and thus addition of contamination to the patterning device during stud removal does not pose a significant problem. A seal may be provided if desired (e.g. a leakage seal).

The stud removal apparatus may further comprise additional stud grippers 1154 and associated elements. For example, four stud grippers and other elements may be provided, one for each stud on the patterning device MA. The stud removal apparatus may generally correspond in form with the stud attachment apparatus 840 depicted in FIG. 21. For example, actuators may be used to adjust the positions of the stud grippers in the x, y, Z and Rz directions. The actuators may be automated, manual or semi-automated (i.e. partially automated and partially manual). The partition 1142 may separate the actuators from a controlled environment in which the mask is provided. The actuators may be provided in a box located beneath the partition 1142. Alignment measurement systems may also be provided beneath the partition 842. The alignment measurement systems may for example comprise imaging systems which are used to ensure that the stud grippers 1154 are positioned at correct locations before they engage with the studs 51.

Points at which the mask comes into contact with the stud removal apparatus 1150 may be provided with a coating of PEEK or some other robust material. Similarly, points at which the mask comes into contact with the housing may be provided with a coating of PEEK or some other robust material.

The stud attachment apparatus 840 and stud removal apparatus 1150 may be provided as a single apparatus or may be provided as separate apparatuses.

A lift unit 845 and housing are depicted only in FIG. 20, and are shown as part of the stud attachment apparatus 840. However, a lift unit may similarly be provided as part of a pellicle frame attachment and/or removal apparatus and/or may similarly be provided as part of a stud removal apparatus. The lift unit may be configured to raise and lower a housing which may form part of a mask transport device. A patterning device (e.g. a mask) may be held by the housing. The mask, housing and lift unit may be provided in a controlled environment.

In an embodiment, instead of using a weight to remove a stud 51 from the patterning device MA an actuator may be used to apply downward force to the stud. The actuator may for example be a Lorentz actuator. The Lorentz actuator may be configured to pull the studs in the z-direction only.

In an embodiment, instead of heating the stud 51 the patterning device MA may be heated (e.g. using a heater located above the patterning device). An advantage of this approach is that glue will tend to break at its interface with the patterning device, thereby leaving significantly less residual glue on the patterning device once the stud has been removed.

In an embodiment, instead of heating the glue to melt it the glue may be dissolved via application of a suitable solvent.

Glue may be cleaned from the patterning device MA using a cleaning apparatus. The cleaning apparatus may form part of the stud removal apparatus, or may be provided as a separate apparatus. The patterning device MA may be placed into a sealed box for transportation to a cleaning apparatus. The cleaning apparatus may be configured to remove contamination from the mask (which may include removing glue from the mask).

Although some embodiments of the invention are described with reference to studs, where the context allows embodiments of the invention may use any form of protrusion.

Although in the described embodiment the frame 17 and mountings 50 are attached to each other before the pellicle 19 is attached to the frame, attachment of these elements may take place in any suitable order. For example, the frame 17 and pellicle 19 may be secured together, following which the mountings 50 may be attached the frame. The mountings 50 maybe attached to the frame 17 using an attachment apparatus which generally corresponds with the pellicle attachment apparatus 855.

References to a mask in this document may be interpreted as references to a patterning device (a mask is an example of a patterning device).

References to glue in this document may be interpreted as referring to adhesive in general.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A pellicle frame attachment apparatus configured to receive a patterning device and a pellicle assembly comprising a pellicle frame and a pellicle, the pellicle attachment device comprising manipulators configured to operate an engagement mechanism of a sub-mount provided on a pellicle frame, wherein the manipulators project through or project from openings provided in a partition which separates a pellicle assembly receiving controlled environment from other parts of the pellicle frame attachment apparatus.

2. The pellicle frame attachment apparatus of claim 1, wherein the partition includes windows positioned to allow pellicle border edges, pellicle frame edges or alignment marks on the patterning device to be visible from an opposite side of the partition.

3. The pellicle frame attachment apparatus of claim 2, wherein imaging sensors are provided on one side of the windows and are configured to look through the windows to view the pellicle edges, pellicle frame edges and/or alignment marks on the patterning device.

4. The pellicle frame attachment apparatus of claim 2, wherein alignment marks are provided on the windows.

5. The pellicle frame attachment apparatus of 1, wherein the manipulators comprise pins connected to an actuator, the actuator being configured to move the pins in a generally vertical direction.

6. The pellicle frame attachment apparatus of claim 5, wherein the pins are moveable relative to a pair of hooked arms.

7. The pellicle frame attachment apparatus of claim 6, wherein the pair of hooked arms are connected to an actuator, the actuator being configured to move the hooked arms in a generally horizontal direction.

8. The pellicle frame attachment apparatus of claim 7, wherein the pair of hooked arms are fixed to the partition, and wherein the actuator is configured to move the partition and the pair of hooked arms in unison.

9. The pellicle frame attachment apparatus of claim 6, wherein an additional pin is provided, the additional pin being movable in the generally vertical direction relative to the moveable pins.

10. The pellicle frame attachment apparatus of claim 9, wherein the additional pin is resiliently biased relative to the moveable pins.

11. The pellicle frame attachment apparatus of claim 1, wherein the partition is connected to or forms part of a support structure.

12. The pellicle frame attachment apparatus of claim 1, wherein ends of the manipulators are provided with a coating of robust material.

13. The pellicle frame attachment apparatus of claim 1, wherein the pellicle frame attachment apparatus includes a gas outlet in the controlled environment, the gas outlet being configured to supply gas at a pressure which is higher than a gas pressure on an opposite side of the partition.

14. A stud attachment apparatus comprising a support structure configured to hold a patterning device and a stud manipulator configured to bring a stud into contact with the patterning device, wherein the stud manipulator is separated from a patterning device receiving controlled environment by a partition, the partition including a hole through which the stud may project in order to contact the patterning device.

15. The stud attachment apparatus of claim 14, wherein the stud manipulator is one of a plurality of stud manipulators and the hole in the partition is one of a plurality of holes.

16. The stud attachment apparatus of claim 14, wherein the stud attachment apparatus includes a gas outlet in the controlled environment, the gas outlet being configured to supply gas at a pressure which is higher than a gas pressure on an opposite side of the partition.

17. The stud attachment apparatus of claim 14, wherein a seal is provided around the stud manipulator which in use provides a seal relative to the patterning device to isolate a stud receiving part of the patterning device from other parts of the patterning device.

18. The stud attachment apparatus of claim 17, wherein at least one gas delivery channel and at least one gas extraction channel is provided via which a flow of gas is provided to and from the stud receiving part of the patterning device.

19. The stud attachment apparatus of claim 17, wherein the seal is a leakage seal.

20. The stud attachment apparatus of claim 14, wherein the stud manipulator includes a heater.

21. The stud attachment apparatus of claim 14, wherein the partition includes windows positioned to allow alignment marks on the patterning device to be visible from an opposite side of the partition.

22. The stud attachment apparatus of claim 21, wherein imaging sensors are provided on one side of the windows and are configured to look through the windows to view the alignment marks on the patterning device.

23. The stud attachment apparatus of claim 14, wherein a kinematic connection is provided between the stud manipulator and the support structure.

* * * * *

UNITED STATES PATENT AND TRADEMARK OFFICE
CERTIFICATE OF CORRECTION

| | | |
|---|---|---|
| PATENT NO. | : 10,969,701 B2 | Page 1 of 1 |
| APPLICATION NO. | : 16/572156 | |
| DATED | : April 6, 2021 | |
| INVENTOR(S) | : Van Der Meulen et al. | |

It is certified that error appears in the above-identified patent and that said Letters Patent is hereby corrected as shown below:

In the Claims

In Column 36, Line 57, replace "apparatus of 1" with --apparatus of claim 1--.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*